(12) United States Patent
Imada et al.

(10) Patent No.: US 11,502,257 B2
(45) Date of Patent: Nov. 15, 2022

(54) ORGANIC ELECTROLUMINESCENCE DEVICE AND AMINE COMPOUND FOR ORGANIC ELECTROLUMINESCENCE DEVICE

(71) Applicant: SAMSUNG DISPLAY CO., LTD., Yongin-si (KR)

(72) Inventors: Ichiro Imada, Yokohama (JP); Ichinori Takada, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 442 days.

(21) Appl. No.: 16/654,608

(22) Filed: Oct. 16, 2019

(65) Prior Publication Data
US 2020/0127208 A1 Apr. 23, 2020

(30) Foreign Application Priority Data

Oct. 18, 2018 (KR) .................. 10-2018-0124547

(51) Int. Cl.
*H01L 51/00* (2006.01)
(52) U.S. Cl.
CPC ...... *H01L 51/0059* (2013.01); *H01L 51/0052* (2013.01); *H01L 51/0072* (2013.01); *H01L 51/0073* (2013.01); *H01L 51/0074* (2013.01); *H01L 51/0094* (2013.01)

(58) Field of Classification Search
None
See application file for complete search history.

(56) References Cited

U.S. PATENT DOCUMENTS

| | | | |
|---|---|---|---|
| 6,967,249 B2 | 11/2005 | Mann et al. | |
| 9,412,964 B2 | 8/2016 | Sotoyama et al. | |
| 9,768,391 B2 | 9/2017 | Mujica-Fernaud et al. | |
| 9,972,787 B2 | 5/2018 | Miyake et al. | |

(Continued)

FOREIGN PATENT DOCUMENTS

| | | |
|---|---|---|
| JP | 5609256 B2 | 10/2014 |
| JP | 6034600 B2 | 11/2016 |
| KR | 10-1772990 B1 | 8/2017 |

(Continued)

OTHER PUBLICATIONS

Machine translated English version of JP 2011/108953 A,, Takanori Miyazaki et al. (Year: 2011).*

(Continued)

*Primary Examiner* — Jennifer A Boyd
*Assistant Examiner* — Seokmin Jeon
(74) *Attorney, Agent, or Firm* — Lewis Roca Rothgerber Christie LLP

(57) ABSTRACT

Provided are an organic electroluminescence device including an amine compound represented by Formula 1 in at least one of a plurality of organic layers and an amine compound represented by Formula 1.

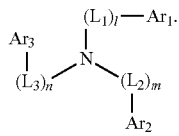

[Formula 1]

20 Claims, 2 Drawing Sheets

(56) References Cited

U.S. PATENT DOCUMENTS

2019/0016666 A1     1/2019   Jeong et al.
2019/0097157 A1     3/2019   Takada et al.

FOREIGN PATENT DOCUMENTS

| KR | 10-1790321 B1 | 10/2017 |
| KR | 2019-0036009 A | 4/2019 |
| WO | WO 03/055872 A1 | 7/2003 |

OTHER PUBLICATIONS

Henkel et al. "A General Synthesis of N-Substituted . . . , etc." J. Org. Chem. 1981, 46, 3483-3486.

Tanaka et al. "Molecular Dynamics Study-guided identification . . . , etc." Bioorganic & Medicinal Chemistry Letters, 24 (2018), 4001-4005.

* cited by examiner

ORGANIC ELECTROLUMINESCENCE DEVICE AND AMINE COMPOUND FOR ORGANIC ELECTROLUMINESCENCE DEVICE

CROSS-REFERENCE TO RELATED APPLICATION

Korean Patent Application No. 10-2018-0124547, filed on Oct. 18, 2018, in the Korean Intellectual Property Office, and entitled: "Organic Electroluminescence Device and Amine Compound for Organic Electroluminescence Device," is incorporated by reference herein in its entirety.

BACKGROUND

1. Field

Embodiments relate to an organic electroluminescence device and an amine compound for an organic electroluminescence device.

2. Description of the Related Art

An organic electroluminescence display is different from a liquid crystal display and is so called a self-luminescent display which accomplishes display by recombining holes and electrons injected from a first electrode and a second electrode in an emission layer and emitting light from a luminescent material which includes an organic compound in the emission layer. As an organic electroluminescence device, for example, an organic electroluminescence device composed of a first electrode, a hole transport layer disposed on the first electrode, an emission layer disposed on the hole transport layer, an electron transport layer disposed on the emission layer, and a second electrode disposed on the electron transport layer is known. Holes are injected from the first electrode, and the injected holes move via the hole transport layer to be injected into the emission layer. Meanwhile, electrons are injected from the second electrode, and the injected electrons move via the electron transport layer to be injected into the emission layer. By recombining the holes and electrons injected into the emission layer, excitons are generated in the emission layer. The organic electroluminescence device emits light using light emitted during the transition of the excitons back to a ground state.

SUMMARY

Embodiments are directed to CLAIM LANGUAGE TO BE ADDED

In an example embodiment, an organic electroluminescence device may include a first electrode, a second electrode disposed on the first electrode, and a plurality of organic layers disposed between the first electrode and the second electrode. At least one of the organic layers may include an amine compound represented by Formula 1.

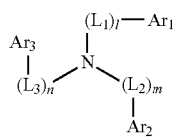

[Formula 1]

In Formula 1, $L_1$ to $L_3$ may be each independently a direct linkage, a substituted or unsubstituted arylene group having 6 to 30 ring carbon atoms, or a substituted or unsubstituted heteroarylene group having 5 to 30 ring carbon atoms. l, m, and n may be each independently an integer of 1 to 2. $Ar_1$ to $Ar_3$ may be each independently a substituted or unsubstituted aryl group having 6 to 30 ring carbon atoms, a substituted or unsubstituted heteroaryl group having 5 to 30 ring carbon atoms, or a group represented by Formula 2. At least one of $Ar_1$ to $Ar_3$ may be represented by Formula 2.

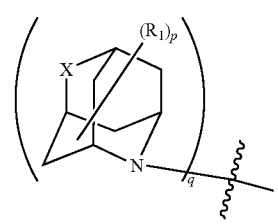

[Formula 2]

In Formula 2, X may be $CR_2R_3$ or $NR_4$. $R_1$ to $R_4$ may be each independently a hydrogen atom, a deuterium atom, a halogen atom, a cyano group, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted arylthio group having 6 to 30 ring carbon atoms, a substituted or unsubstituted alkylamino group having 1 to 10 carbon atoms, a substituted or unsubstituted arylamino group having 6 to 30 ring carbon atoms, a substituted or unsubstituted aryl group having 6 to 50 ring carbon atoms, or a substituted or unsubstituted heteroaryl group having 2 to 50 ring carbon atoms, or form a ring by combining adjacent groups with each other, p may be an integer of 1 to 12. q may be 1 or 2.

In an example embodiment, Formula 2 may be represented by Formula 3-1 or 3-2.

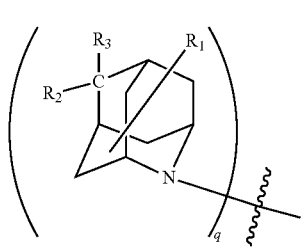

[Formula 3-1]

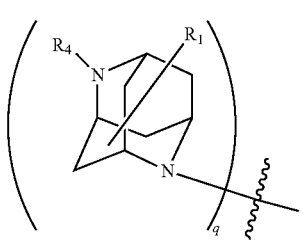

[Formula 3-2]

In Formulae 3-1 and 3-2, $R_1$ to $R_4$, and q may be the same as defined in Formula 2.

In an example embodiment, in Formulae 3-1 and 3-2, $R_1$ to $R_4$ may be each independently a hydrogen atom, a substituted or unsubstituted aryl group having 6 to 50 ring carbon atoms, or a substituted or unsubstituted heteroaryl group having 2 to 50 ring carbon atoms, and q may be the same as defined in Formula 2. In an example embodiment, $R_1$ to $R_4$ may be each independently a hydrogen atom, a substituted or unsubstituted phenyl group, a substituted or unsubstituted naphthyl group, a substituted or unsubstituted fluorenyl group, a substituted or unsubstituted carbazole group, a substituted or unsubstituted dibenzofuran group, or a substituted or unsubstituted dibenzothiophene group.

In an example embodiment, in Formula 1, $L_1$ to $L_3$ may be each independently a direct linkage, a substituted or unsubstituted phenylene group, a substituted or unsubstituted divalent biphenyl group, or a substituted or unsubstituted fluorenylene group.

In an example embodiment, in Formula 1, $Ar_1$ to $Ar_3$ may be each independently a substituted or unsubstituted phenyl group, a substituted or unsubstituted biphenyl group, a substituted or unsubstituted naphthyl group, a substituted or unsubstituted fluorenyl group, a substituted or unsubstituted phenanthryl group, a substituted or unsubstituted dibenzofuranyl group, or a substituted or unsubstituted dibenzothiophenyl group.

In an example embodiment, in Formula 1, $Ar_1$ to $Ar_3$ may be each independently an aryl group substituted with a methyl group, an unsubstituted phenyl group, or a triphenylsilyl group, or a heteroaryl group substituted with a methyl group, an unsubstituted phenyl group, or a triphenylsilyl group.

In an example embodiment, in Formula 1, one or two of $Ar_1$ to $Ar_3$ may be represented by Formula 2.

In an example embodiment, Formula 3-1 may be represented by Formula 4-1-1 or 4-1-2, and Formula 3-2 may be represented by Formula 4-2.

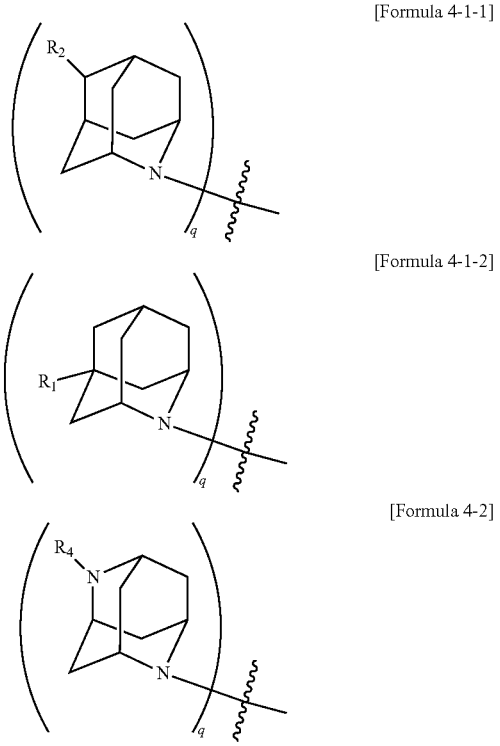

[Formula 4-1-1]

[Formula 4-1-2]

[Formula 4-2]

In Formulae 4-1-1, 4-1-2 and 4-2, $R_1$, $R_2$, $R_4$ and q may be the same as defined in Formulae 3-1 and 3-2.

In an example embodiment, the organic layers may include a hole transport region disposed on the first electrode, an emission layer disposed on the hole transport region, and an electron transport region disposed on the emission layer, and the hole transport region may include the amine compound represented by Formula 1.

An embodiment may provide an amine compound represented by the above Formula 1.

BRIEF DESCRIPTION OF THE DRAWINGS

Features will become apparent to those of skill in the art by describing in detail example embodiments with reference to the attached drawings in which.

DETAILED DESCRIPTION

Figure 1:
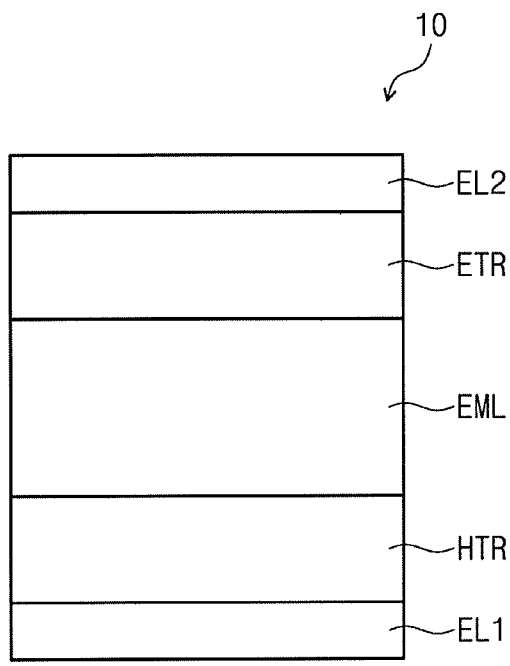
FIG. 1 illustrates a schematic cross-sectional view of an organic electroluminescence device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be understood that the terms "comprise" or "have," when used in this specification, specify the presence of stated features, numerals, steps, operations, elements, parts, or a combination thereof, but do not preclude the presence or addition of one or more other features, numerals, steps, operations, elements, parts, or a combination thereof.

In the present disclosure, when a layer, a film, a region, a plate, etc. is referred to as being "on" or "above" another part, it can be "directly on" the other part, or intervening parts may also be present. On the contrary, when a layer, a film, a region, a plate, etc. is referred to as being "under" or "below" another part, it can be "directly under" the other part, or intervening parts may also be present. Furthermore, when used in this specification, the term "disposed on" may encompass both orientations of above and below.

In the present disclosure, "substituted or unsubstituted" may mean unsubstituted or substituted with at least one substituent selected from the group consisting of deuterium, halogen, cyano, nitro, amino, silyl, oxy, thio, sulfinyl, sulfonyl, carbonyl, boron, phosphine oxide, phosphine sulfide, alkyl, alkenyl, alkoxy, hydrocarbon ring, aryl and heterocyclic group. In addition, each of the substituent illustrated above may be substituted or unsubstituted. For example, biphenyl may be interpreted as aryl, or phenyl substituted with phenyl. A heterocyclic group includes aliphatic heterocycle and aromatic heterocycle (heteroaryl group).

In the present disclosure, the term "forming a ring by combining adjacent groups with each other" may mean forming a substituted or unsubstituted hydrocarbon ring, or a substituted or unsubstituted heterocycle by combining adjacent groups with each other. The hydrocarbon ring includes an aliphatic hydrocarbon ring and an aromatic hydrocarbon ring. The heterocycle includes an aliphatic heterocycle and an aromatic heterocycle. The hydrocarbon ring and heterocycle may be a monocycle or a polycycle. In addition, the ring formed by combining adjacent groups may be connected with another ring to form a spiro structure.

In the present disclosure, the term "an adjacent group" may mean a substituent at an atom which is directly connected with another atom at which a corresponding substituent is substituted, another substituent at an atom at which a corresponding substituent is substituted, or a substituent stereoscopically disposed at the nearest position to a corresponding substituent. For example, two methyl groups in 1,2-dimethylbenzene may be interpreted as "adjacent groups", and two ethyl groups in 1,1-diethylcyclopentene may be interpreted as "adjacent groups".

In the present disclosure, examples of a halogen atom are a fluorine atom, a chlorine atom, a bromine atom, or an iodine atom.

In the present disclosure, the alkyl group may have a linear, branched or cyclic form. The carbon number of the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc. . . . .

In the present disclosure, the hydrocarbon ring means any functional group or substituent derived from an aliphatic hydrocarbon ring. The hydrocarbon ring may be a saturated hydrocarbon ring including 5 to 20 ring carbon atoms.

In the present disclosure, the aryl group means any functional group or substituent derived from an aromatic hydrocarbon ring. The aryl group may be monocyclic aryl or polycyclic aryl. The carbon number of the aryl group for forming a ring may be 6 to 50, 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc.

In the present disclosure, the fluorenyl group may be substituted, and two substituents may be combined with each other to form a spiro structure. Examples of the substituted fluorenyl group may include groups.

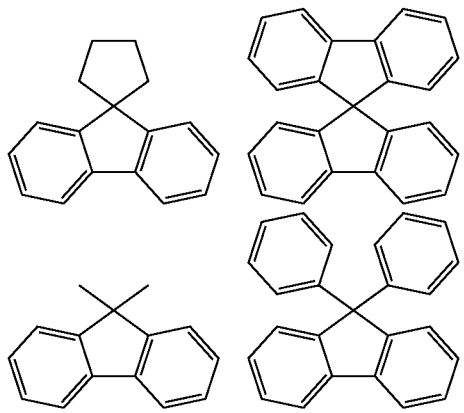

In the present disclosure, the heteroaryl group may be heteroaryl including at least one of B, O, N, P, Si, or S as a heteroatom. When the heteroaryl group includes two or more heteroatoms, these heteroatoms may be the same or different from each other. The heteroaryl group may be monocyclic heteroaryl or polycyclic heteroaryl. The carbon number of the heteroaryl group for forming a ring may be 2 to 50, 2 to 30, 2 to 20, or 2 to 10. Examples of the heteroaryl group may include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-aryl carbazole, N-heteroaryl carbazole, N-alkyl carbazole, benzoxazole, benzoimidazole, benzothiazole, benzocarbazole, benzothiophene, dibenzothiophene, thienothiophene, benzofuran, phenanthroline, thiazole, isoxazole, oxadiazole, thiadiazole, phenothiazine, dibenzosilole, dibenzofuran, etc. . . . .

In the present disclosure, the above explanation on the aryl group may be applied to the arylene group, except that the arylene group is divalent. The above explanation on the heteroaryl group may be applied to the heteroarylene group, except that the heteroarylene group is divalent.

In the present disclosure, the silyl group includes alkyl silyl and aryl silyl. Examples of the silyl group may include trimethylsilyl, triethylsilyl, t-butyl dimethylsilyl, vinyl dimethylsilyl, propyl dimethylsilyl, triphenylsilyl, diphenylsilyl, phenylsilyl, etc.

In the present disclosure, the carbon number of the amino group is not specifically limited, and may be 1 to 30. The amino group may include alkyl amino, aryl amino, or heteroaryl amino. Examples of the amino group include methylamino, dimethylamino, phenylamino, diphenylamino, naphthylamino, 9-methyl-anthracenylamino, triphenylamino, etc.

In the present disclosure, the above-described examples of the alkyl group may be applied to the alkyl group in alkylthio, alkylaryl, alkylamino, alkylsilyl, alkylamine and alkoxy.

In the present disclosure, the above-described examples of the aryl group may be applied to the aryl group in aryloxy, arylthio, arylamino and arylsilyl.

In the present disclosure, a direct linkage may mean a single bond.

In the present disclosure,

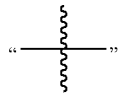 means a position to be connected.

FIG. 1 is a schematic cross-sectional view illustrating an organic electroluminescence device according to an example embodiment.

An organic electroluminescence device 10 according to an example embodiment may include a first electrode EL1, a hole transport region HTR, an emission layer EML, an electron transport region ETR, and a second electrode EL2, laminated in order.

Figure 2:
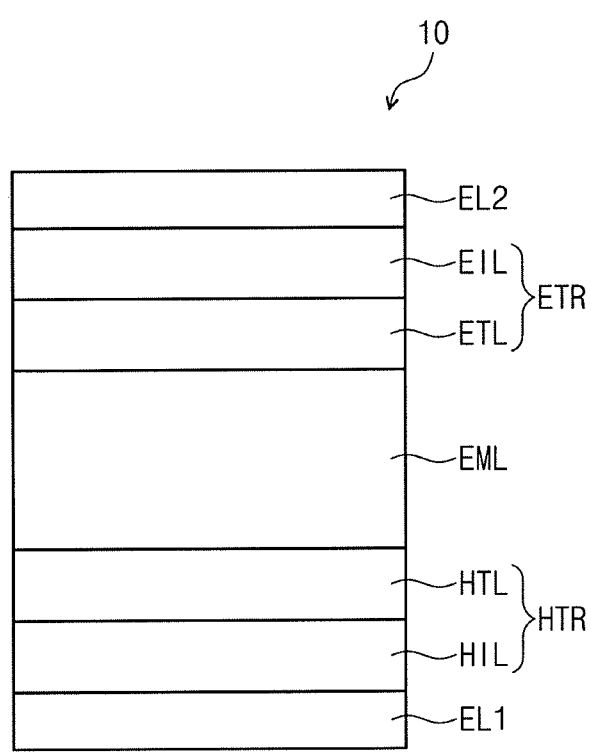
FIG. 2 illustrates a schematic cross-sectional view of an organic electroluminescence device according to an example embodiment.

Comparing with FIG. 1, FIG. 2 shows a schematic cross-sectional view illustrating an organic electroluminescence device 10 according to an example embodiment, in which a hole transport region HTR includes a hole injection layer HIL and a hole transport layer HTL, and an electron transport region ETR includes an electron injection layer EIL and an electron transport layer ETL.

Figure 3:
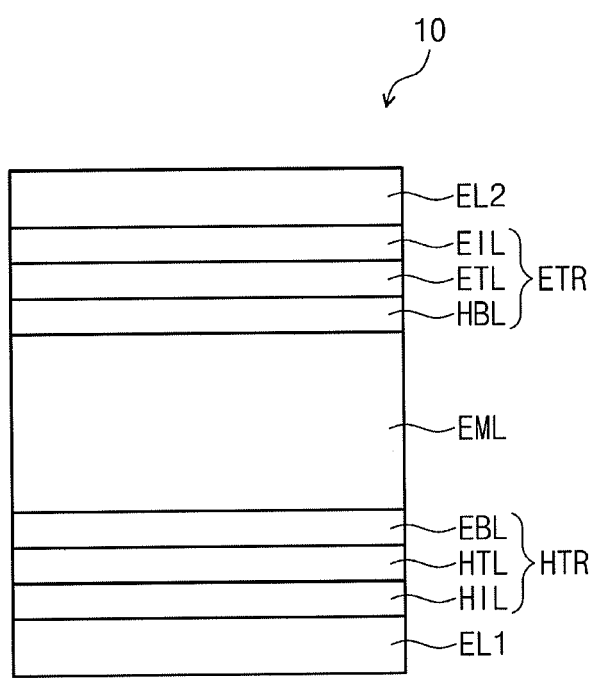
FIG. 3 illustrates a schematic cross-sectional view of an organic electroluminescence device according to an example embodiment.

Furthermore, comparing with FIG. 1, FIG. 3 shows a schematic cross-sectional view illustrating an organic electroluminescence device 10 according to an example embodiment, in which a hole transport region HTR includes a hole injection layer HIL, a hole transport layer HTL and an electron blocking layer EBL, and an electron transport region ETR includes an electron injection layer EIL, an electron transport layer ETL and a hole blocking layer HBL.

The first electrode EL1 has conductivity. The first electrode EL1 may be formed by a metal alloy or a conductive compound. The first electrode EL1 may be an anode. The first electrode EL1 may also be a pixel electrode. The first electrode EL1 may be a transmissive electrode, a transflective electrode, or a reflective electrode. In case the first electrode EL1 is the transmissive electrode, the first electrode EL1 may include a transparent metal oxide such as indium tin oxide (ITO), indium zinc oxide (IZO), zinc oxide (ZnO), or indium tin zinc oxide (ITZO). In case the first electrode EL1 is the transflective electrode or reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or transflective layer formed using the above materials, and a transparent conductive layer formed using ITO, IZO, ZnO, or ITZO. For example, the first electrode EL1 may have a triple-layer structure of ITO/Ag/ITO. However, an embodiment is not limited thereto. The thickness of the first electrode EL1 may be from about 1,000 Å to about 10,000 Å, for example, from about 1,000 Å to about 3,000 Å.

In an organic electroluminescence device 10 according to an example embodiment, at least one of the organic layers included in the hole transport region HTR, the emission layer EML, and the electron transport region ETR may include an amine compound represented by Formula 1.

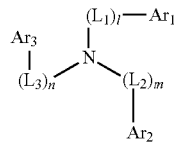

[Formula 1]

In Formula 1, $L_1$ to $L_3$ may be each independently a direct linkage, an arylene group, or a heteroarylene group. The arylene group may be a substituted or unsubstituted arylene group having 6 to 30 ring carbon atoms, and the heteroarylene group may be a substituted or unsubstituted heteroarylene group having 5 to 30 ring carbon atoms. For example, $L_1$ to $L_3$ may be each independently a direct linkage, a substituted or unsubstituted phenylene group, a substituted or unsubstituted divalent biphenyl group, or a substituted or unsubstituted fluorenylene group. $L_1$ to $L_3$ may be each independently substituted with a phenyl group. For example, $L_1$ to $L_3$ may be each independently a phenyl group substituted with a phenyl group or a fluorenylene group substituted with a phenyl group.

l, m, and n may be each independently an integer of 1 to 2. For example, at least one of l, m, or n may be 1. When at least two of l, m, or n are 1 or more, $L_1$ to $L_3$ may be the same or different from each other.

$Ar_1$ to $Ar_3$ may be each independently an aryl group or a heteroaryl group. The aryl group may be a substituted or unsubstituted aryl group having 6 to 30 ring carbon atoms, and the heteroaryl group may be a substituted or unsubstituted heteroaryl group having 5 to 30 ring carbon atoms. For example, $Ar_1$ to $Ar_3$ may be each independently a substituted or unsubstituted phenyl group, a substituted or unsubstituted biphenyl group, a substituted or unsubstituted naphthyl group, a substituted or unsubstituted fluorenyl group, a substituted or unsubstituted phenanthryl group, a substituted or unsubstituted dibenzofuranyl group, or a substituted or unsubstituted dibenzothiophenyl group. For example, $Ar_1$ to $Ar_3$ may be each independently an aryl group substituted with a methyl group, an unsubstituted phenyl group, or a triphenylsilyl group, or a heteroaryl group substituted with a methyl group, an unsubstituted phenyl group, or a triphenylsilyl group. $Ar_1$ to $Ar_3$ may be the same or different from each other. Furthermore, $Ar_1$ to $Ar_3$ may not be linked by combining with each other.

At least one of $Ar_1$ to $Ar_3$ may be represented by Formula 2.

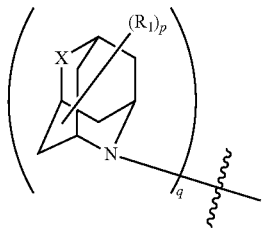

[Formula 2]

In Formula 2, X may be $CR_2R_3$ or $NR_4$.

$R_1$ to $R_4$ may be each independently a hydrogen atom, a deuterium atom, a halogen atom, a cyano group, a substituted or unsubstituted silyl group, a substituted or unsubstituted alkyl group, a substituted or unsubstituted alkoxy group, a substituted or unsubstituted arylthio group, a substituted or unsubstituted alkylamino group, a substituted or unsubstituted arylamino group, a substituted or unsubstituted aryl group, or a substituted or unsubstituted heteroaryl group, or form a ring by combining adjacent groups with each other. The substituted silyl group may be an alkylsilyl group substituted with an alkyl group. The substituted or unsubstituted alkyl group may be a substituted or unsubstituted alkyl group having 1 to 10 carbon atoms, and the substituted or unsubstituted alkoxy group may be a substituted or unsubstituted alkoxy group having 1 to 10 carbon atoms. The substituted or unsubstituted arylthio group may be a substituted or unsubstituted arylthio group having 6 to 30 ring carbon atoms, the substituted or unsubstituted alkylamino group may be a substituted or unsubstituted alkylamino group having 1 to 10 carbon atoms, and a substituted or unsubstituted arylamino group may be a substituted or unsubstituted arylamino group having 6 to 30 ring carbon atoms. The substituted or unsubstituted aryl group may be a substituted or unsubstituted aryl group having 6 to 50 ring carbon atoms, and the substituted or unsubstituted heteroaryl group may be a substituted or unsubstituted heteroaryl group having 2 to 50 ring carbon atoms. For example, $R_1$ to $R_4$ may be each independently a hydrogen atom or a phenyl group. $R_1$ to $R_3$ may be a hydrogen atom, and $R_4$ may be a phenyl group. $R_2$ to $R_4$ may be a hydrogen atom, and $R_1$ may be a phenyl group.

p may be an integer of 1 to 12. For example, when p is an integer of 2 or more, a plurality of $R_1$ may be the same or different from each other.

q may be 1 or 2. When q is 2, the substituents represented by Formula 2 may be the same or different from each other.

One or two selected from $Ar_1$ to $Ar_3$ may be represented by Formula 2. That is, the amine compound according to an example embodiment may include an aza-adamantyl group or a diaza-adamantyl group. It may include two aza-adamantyl groups or two diaza-adamantyl groups. It may also include an aza-adamantyl group and a diaza-adamantyl group. For example, the amine compound according to an example embodiment may be represented by Formula 1-1 or 1-2.

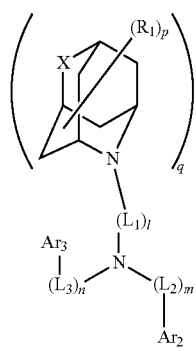

[Formula 1-1]

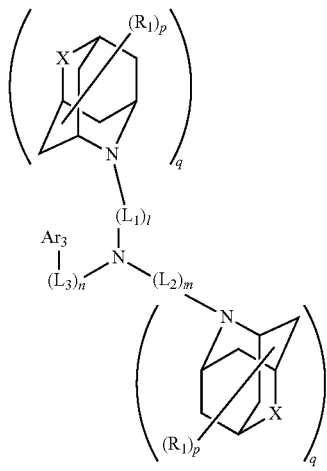

[Formula 1-2]

Formula 1-1 is an embodiment of Formula 1 in which one of $Ar_1$ to $Ar_3$ is represented by Formula 2. Formula 1-2 is an embodiment of Formula 1 in which two of $Ar_1$ to $Ar_3$ are represented by Formula 2. In Formula 1-1, $Ar_2$ and $Ar_3$ may not be represented by Formula 2. In Formula 1-2, $Ar_3$ may not be represented by Formula 2. In Formulae 1-1 and 1-2, $L_1$ to $L_3$, l, m, n, X, $R_1$ to $R_4$, p, and q may be the same as defined in Formulae 1 and 2.

In another embodiment, all of $Ar_1$ to $Ar_3$ may be represented by Formula 2.

Formula 2 may be represented by Formula 3-1 or 3-2.

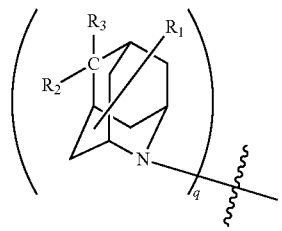

[Formula 3-1]

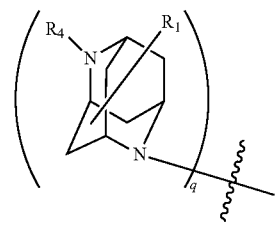

[Formula 3-2]

Each of Formulae 3-1 and 3-2 is an embodiment of Formula 2 in which X and p are specified. Each of Formulae 3-1 and 3-2 is an embodiment of Formula 2 in which p is 1. Formula 3-1 is an embodiment of Formula 2 in which X is $CR_2R_3$, and Formula 3-2 is an embodiment of Formula 2 in which X is $NR_4$. In Formulae 3-1 and 3-2, $R_1$ to $R_4$, p, and q may be the same as defined in Formula 1. For example, $R_1$ to $R_4$ may be each independently a hydrogen atom, a substituted or unsubstituted aryl group, or a substituted or unsubstituted heteroaryl group. For example, $R_1$ to $R_4$ may be each independently a hydrogen atom, a substituted or unsubstituted phenyl group, a substituted or unsubstituted naphthyl group, a substituted or unsubstituted fluorenyl group, a substituted or unsubstituted carbazole group, a substituted or unsubstituted dibenzofuran group, or a substituted or unsubstituted dibenzothiophene group.

Formula 3-1 may be represented by Formula 4-1-1 or 4-1-2, and Formula 3-2 may be represented by Formula 4-2.

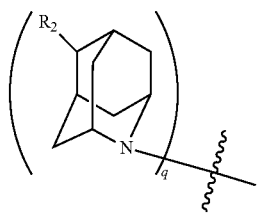

[Formula 4-1-1]

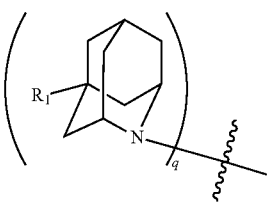

[Formula 4-1-2]

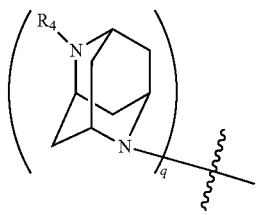

[Formula 4-2]

Formula 4-1-1 is an embodiment of Formula 3-1 in which each of $R_1$ and $R_3$ is hydrogen. Formula 4-1-2 is an embodiment of Formula 3-1 in which each of $R_2$ and $R_3$ is hydrogen and the position of $R_1$ is specified.

Formula 4-2 is an embodiment of Formula 3-2 in which $R_1$ is hydrogen.

In Formulae 4-1-1, 4-1-2 and 4-2, $R_1$, $R_2$, $R_4$, and q may be the same as defined in Formulae 3-1 and 3-2. For example, $R_1$, $R_2$ and $R_4$ may be each independently a hydrogen atom, an unsubstituted phenyl group, an unsubstituted naphthyl group, an unsubstituted dibenzofuran group, or an unsubstituted dibenzothiophene group.

The amine compound according to an example embodiment may be any one of compounds represented in Compound Group 1.

[Compound Group 1]

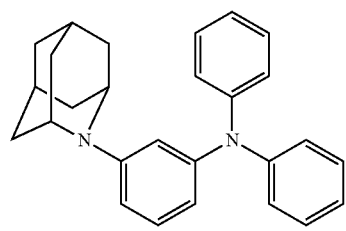

1

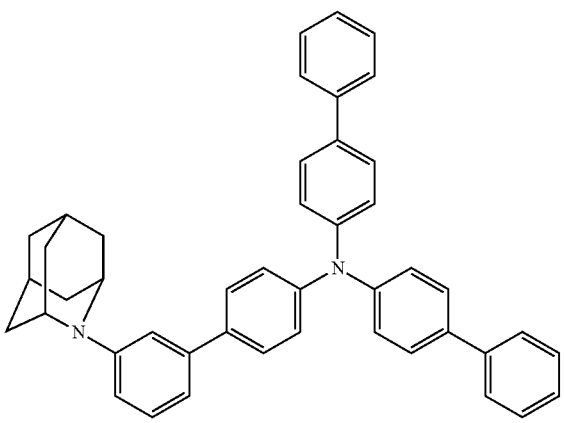

2

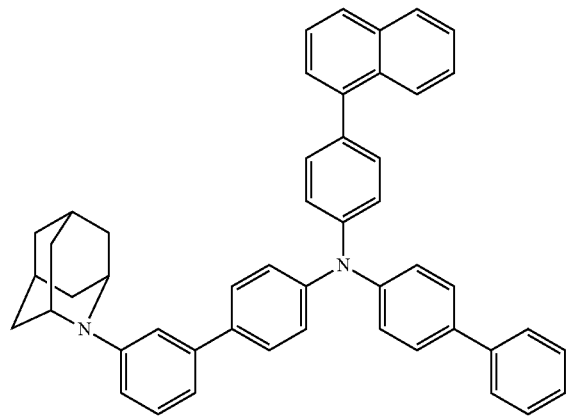

3

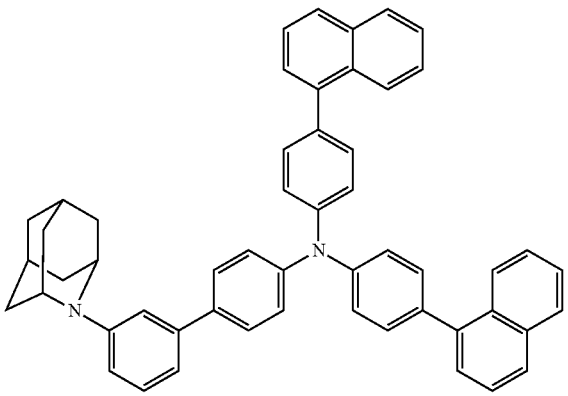

4

5
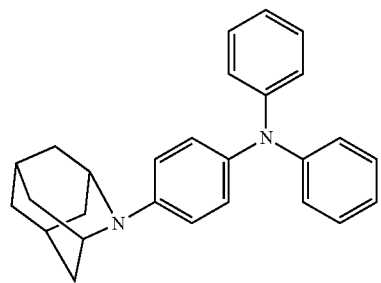
6
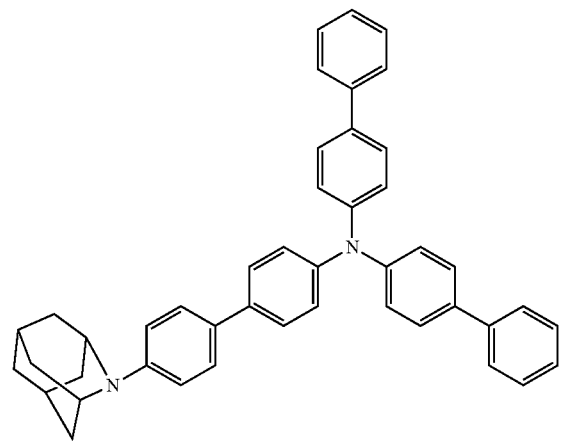
7
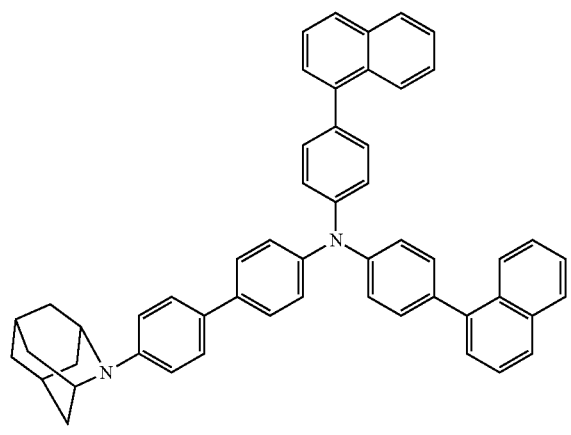
8
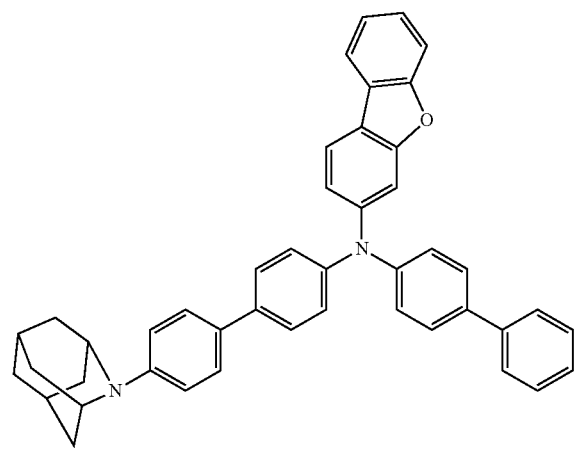
9
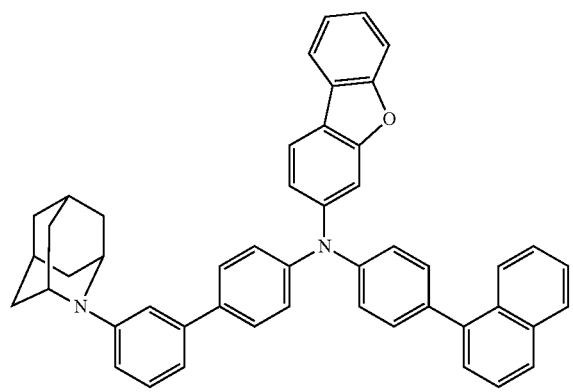
10
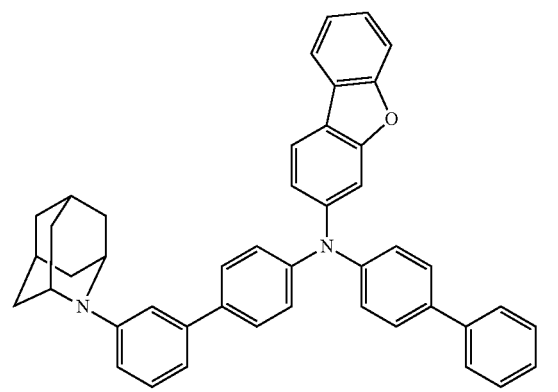

-continued
11
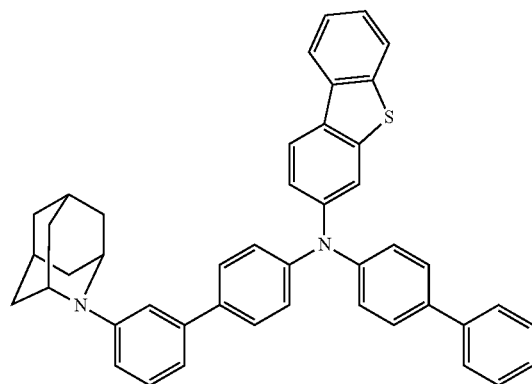
12
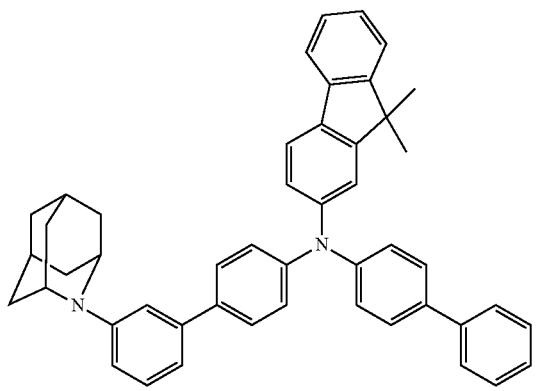
13
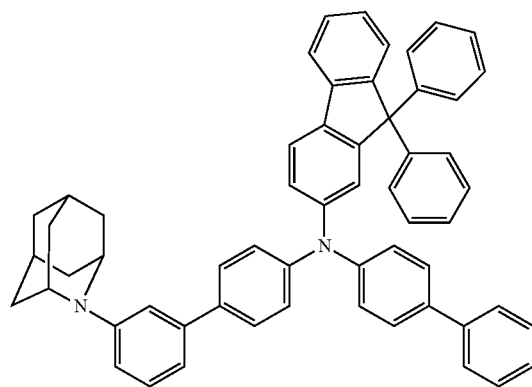
14
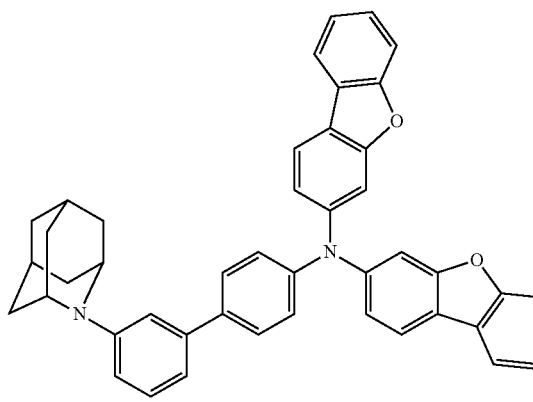
15
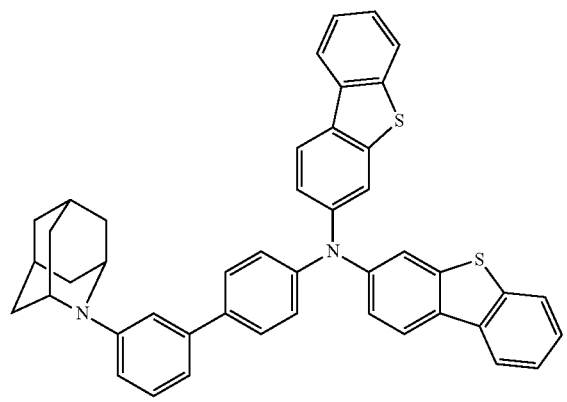
16
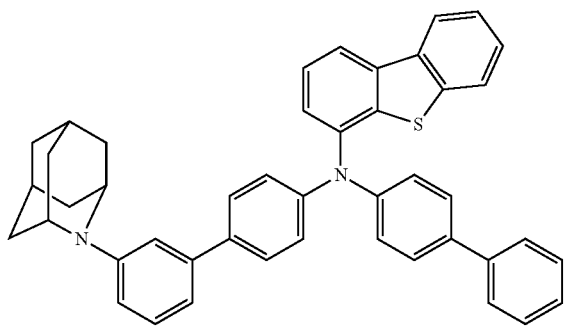
17
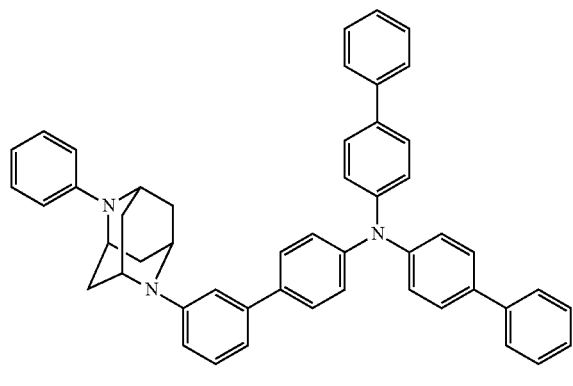
18
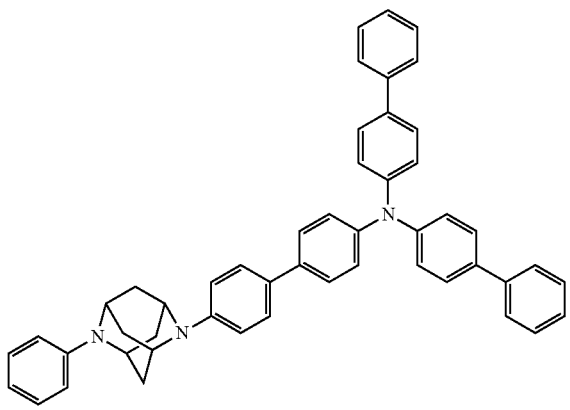

-continued
19
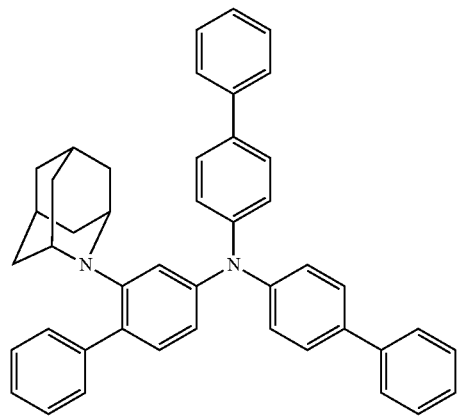
20
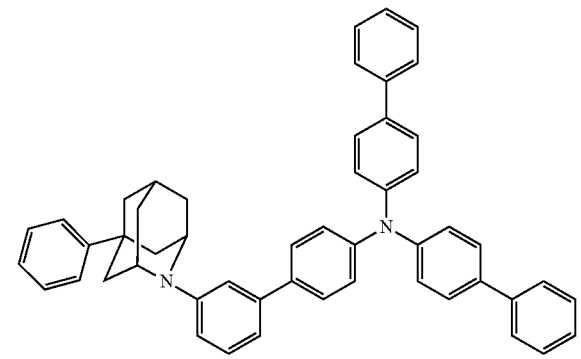
21
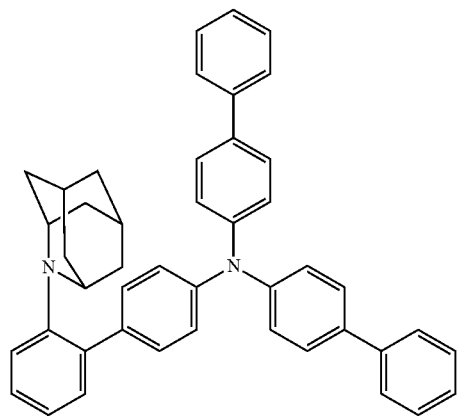
22
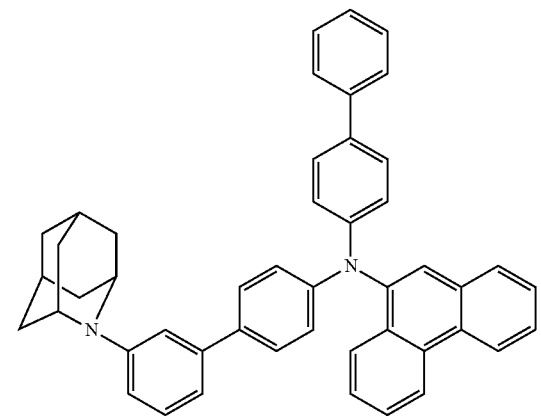
23
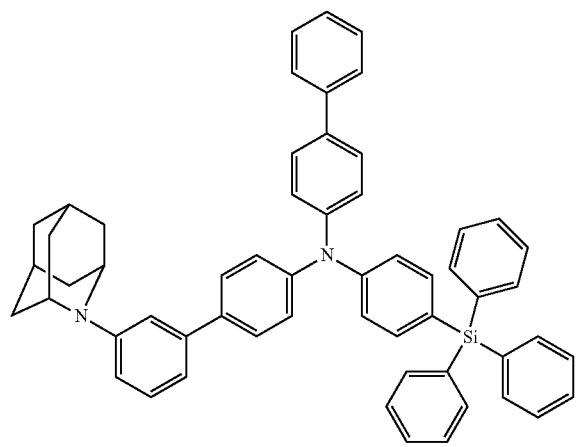
24
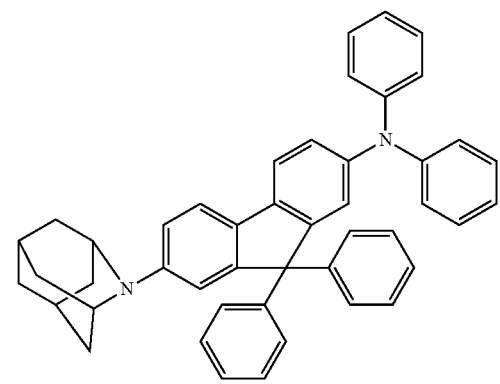

-continued
25
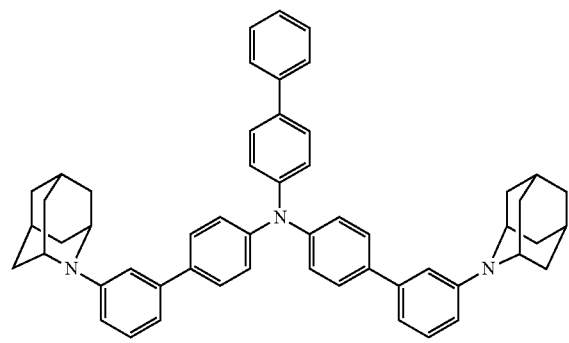
26
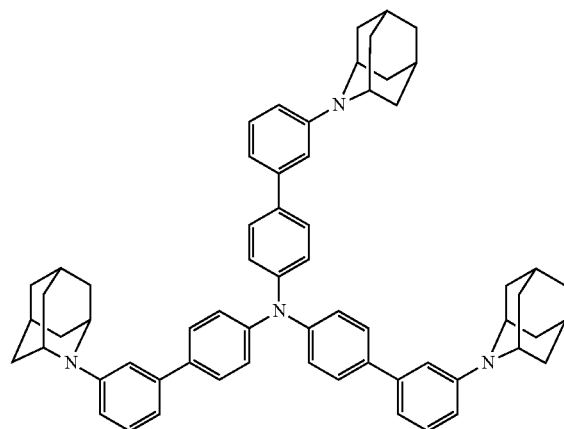
27
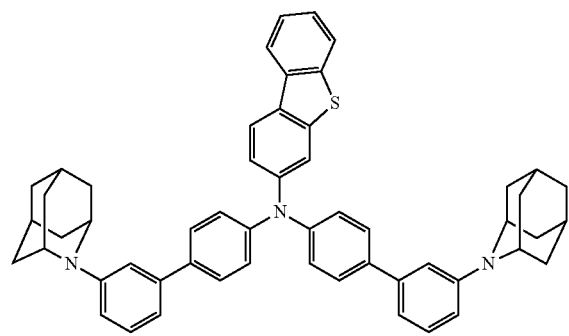
28
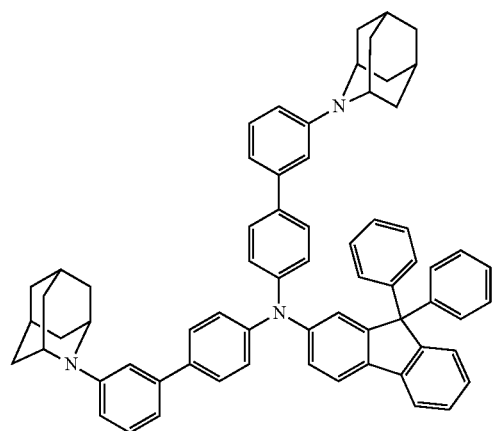
29
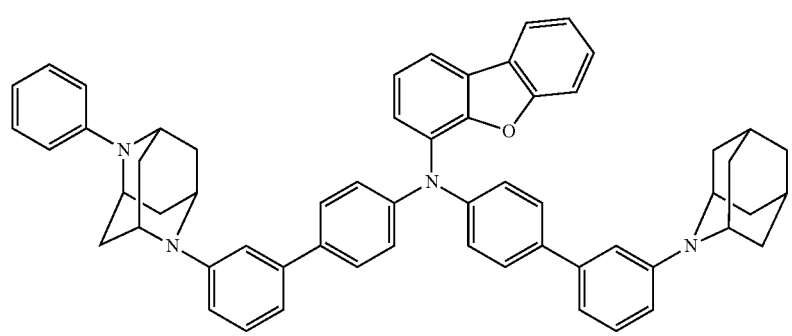

-continued
30
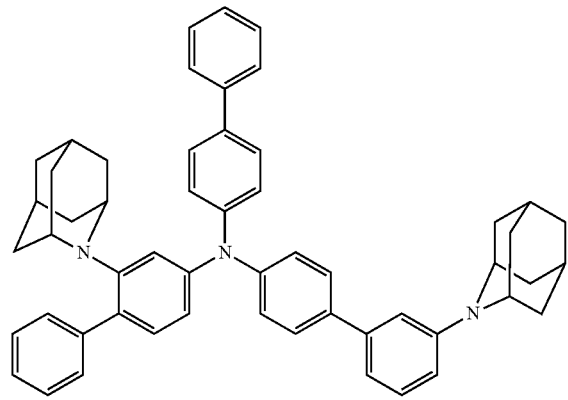
31
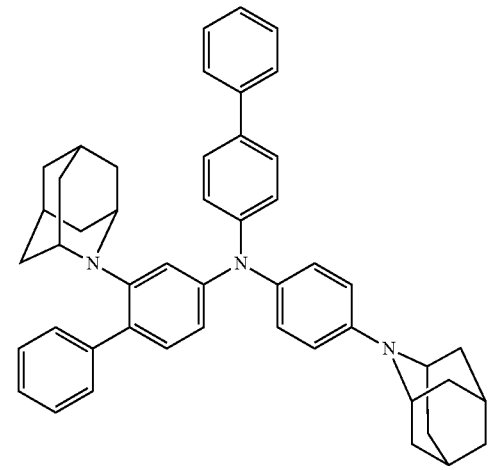
32
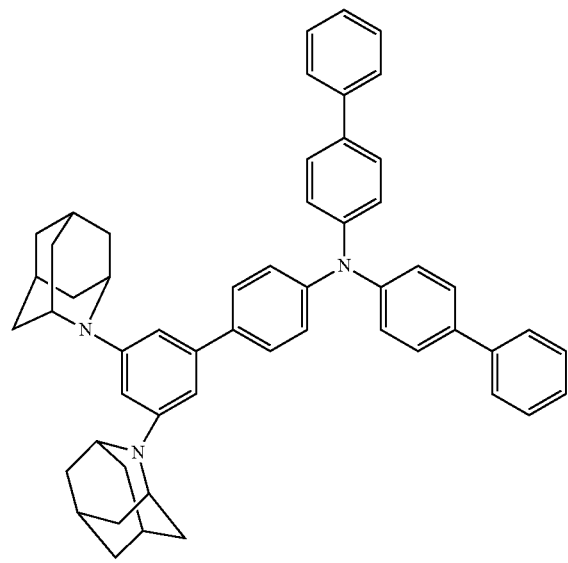
33
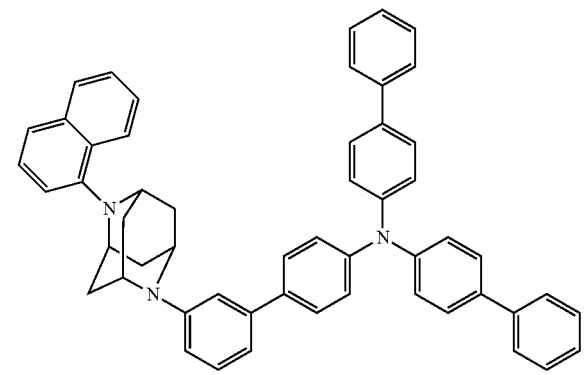
34
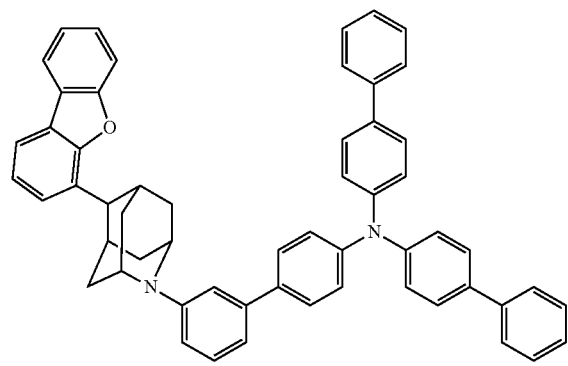
35
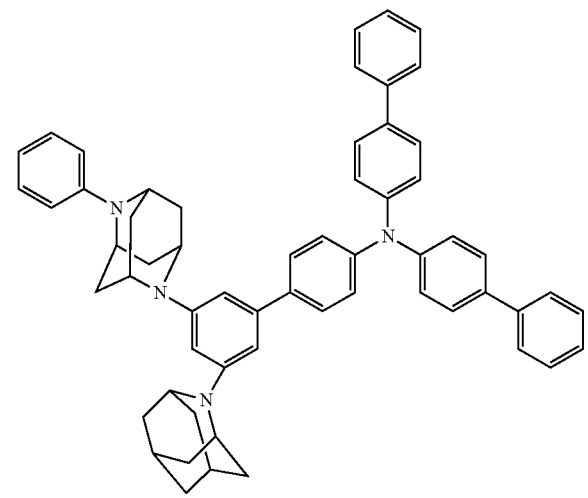

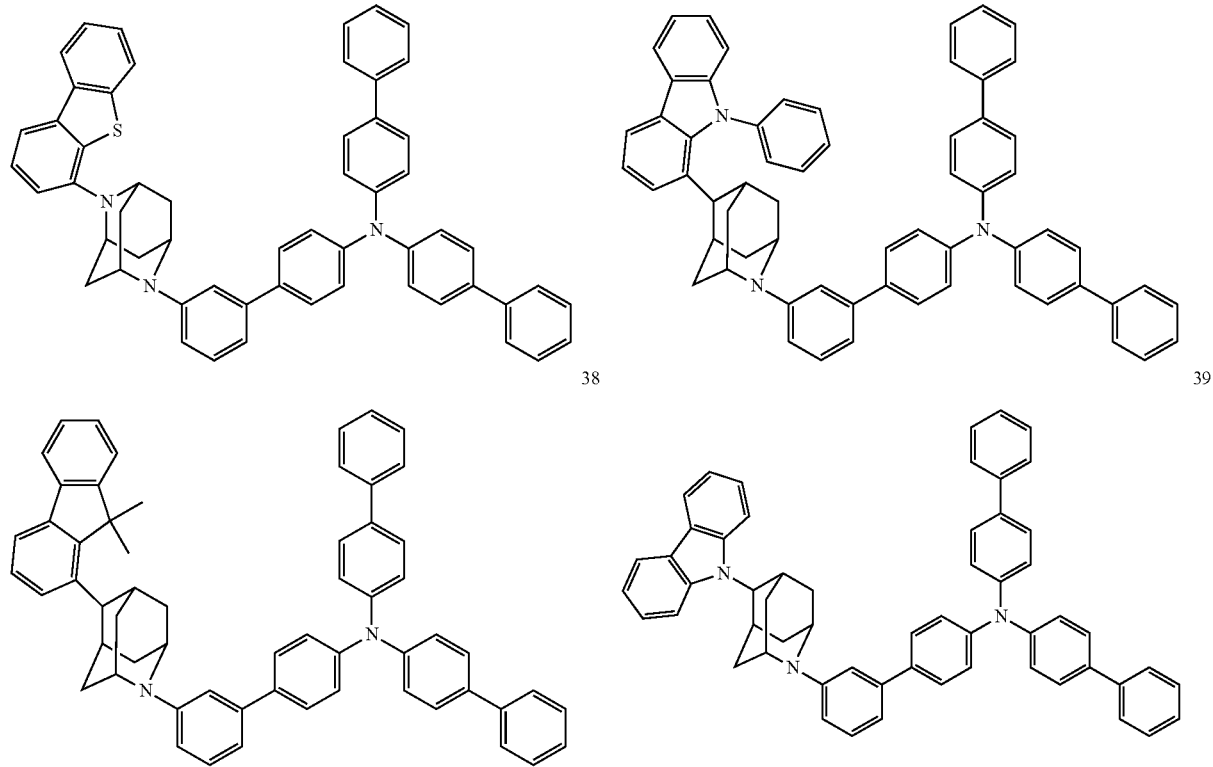

The amine compound according to an example embodiment may be included in the hole transport region HTR among the organic layers (HTR, EML, ETR), and for example in the hole transport layer HTL among the hole transport region HTR.

In the organic electroluminescence device 10 according to an example embodiment as shown in FIGS. 1 to 3, the hole transport region HTR may include one or more of the amine compound represented in Compound Group 1. Meanwhile, the hole transport region HTR may further include a suitable material in addition to the amine compound represented in Compound Group 1.

In the organic electroluminescence device 10 according to an example embodiment, the hole transport region HTR may include the above-described amine compound according to an example embodiment. In case the hole transport region HTR includes a plurality of organic layers, the amine compound according to an example embodiment may be included in the organic layer adjacent to the emission layer EML. For example, the amine compound according to an example embodiment may be included in the hole transport layer HTL of the hole transport region HTR.

For example, in case the organic electroluminescence device 10 according to an example embodiment includes a hole injection layer HIL and a hole transport layer HTL in the hole transport region HTR, the amine compound according to an example embodiment may be included in the hole transport layer HTL.

The hole transport region HTR is disposed on the first electrode EL1. The hole transport region HTR may include at least one of a hole injection layer HIL, a hole transport layer HTL, a hole buffer layer (not shown), or an electron blocking layer EBL.

The hole transport region HTR may have a single layer formed using a single material, a single layer formed using a plurality of different materials, or a multilayer structure including a plurality of layers formed using a plurality of different materials.

For example, the hole transport region HTR may have a single layer structure of a hole injection layer HIL or a hole transport layer HTL, or may have a single layer structure formed using a hole injection material and a hole transport material. In addition, the hole transport region HTR may have a single layer structure formed using a plurality of different materials, or a laminated structure of hole injection layer HIL/hole transport layer HTL, hole injection layer HIL/hole transport layer HTL/hole buffer layer (not shown), hole injection layer HIL/hole buffer layer (not shown), hole transport layer HTL/hole buffer layer (not shown), or hole injection layer HIL/hole transport layer HTL/electron blocking layer EBL, laminated in order from the first electrode EL1.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalen-1-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

In the organic electroluminescence device 10 according to an example embodiment, the hole transport layer HTL may further include a suitable hole transport material in addition to the amine compound according to an example embodiment. For example, the hole transport layer HTL may include carbazole derivatives such as N-phenyl carbazole, polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(naphthalen-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), α-NPD, 1,3-bis(N-carbazolyl)benzene (mCP), etc.

The thickness of the hole transport region HTR may be from about 100 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. In case the thicknesses of the hole transport region HTR, the hole injection layer HIL, the hole transport layer HTL and the electron blocking layer EBL satisfy the above-described ranges, satisfactory hole transport properties may be obtained without substantial increase of a driving voltage.

The hole transport region HTR may further include a charge generating material in addition to the above-described materials to improve conductivity. The charge generating material may be dispersed in the hole transport region HTR uniformly or non-uniformly. The charge generating material may be, for example, a p-dopant. The p-dopant may be one of quinone derivatives, metal oxides, or cyano group-containing compounds. For example, non-limiting examples of the p-dopant may include quinone derivatives such as tetracyanoquinodimethane (TCNQ), and 2,3,5,6-tetrafluoro-tetracyanoquinodimethane (F4-TCNQ), metal oxides such as tungsten oxide and molybdenum oxide.

As described above, the hole transport region HTR may further include at least one of a hole buffer layer (not shown) or an electron blocking layer EBL in addition to the hole injection layer HIL and the hole transport layer HTL. The hole buffer layer (not shown) may compensate an optical resonance distance according to the wavelength of light emitted from the emission layer EML and increase light emission efficiency. Materials included in the hole transport region HTR may be used as materials included in the hole buffer layer (not shown). The electron blocking layer EBL is a layer preventing electron injection from the electron transport region ETR into the hole transport region HTR.

The emission layer EML is disposed on the hole transport region HTR. The thickness of the emission layer EML may be, for example, from about 100 Å to about 1,000 Å, or from about 100 Å to about 300 Å. The emission layer EML may have a single layer formed using a single material, a single layer formed using a plurality of different materials, or a multilayer structure having a plurality of layers formed using a plurality of different materials.

In the organic electroluminescence device 10 according to an example embodiment, the emission layer EML may include anthracene derivatives, pyrene derivatives, fluoranthene derivatives, chrysene derivatives, dihydrobenzanthracene derivatives, or triphenylene derivatives. Specifically, the emission layer EML may include anthracene derivatives or pyrene derivatives.

The emission layer EML may include anthracene derivatives represented by Formula C.

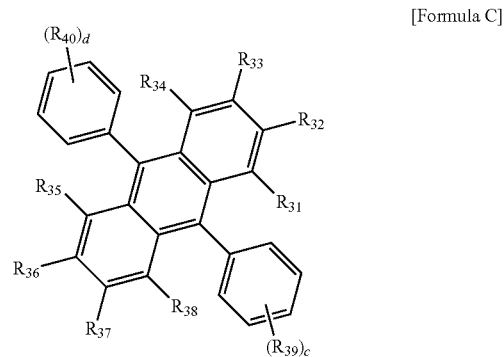

[Formula C]

In Formula C, $R_{31}$ to $R_{40}$ may be each independently a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring carbon atoms, or a substituted or unsubstituted heteroaryl group having 2 to 30 ring carbon atoms, or form a ring by combining adjacent groups with each other. Meanwhile, $R_{31}$ to $R_{40}$ may form a saturated hydrocarbon ring or an unsaturated hydrocarbon ring by combining adjacent groups with each other.

In Formula C, c and d may be each independently an integer of 0 to 5.

The compound represented by Formula C may be represented by any one of Compounds 3-1 to 3-6.

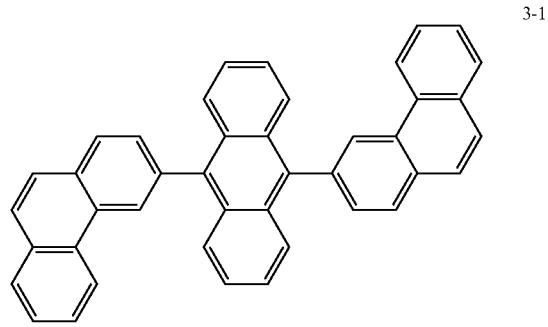

3-1

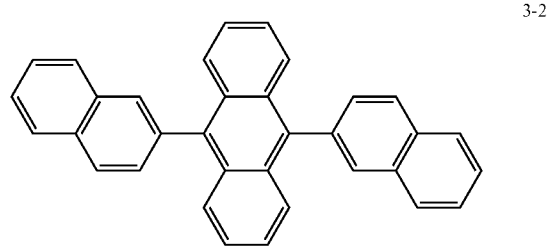

3-2

-continued 3-3
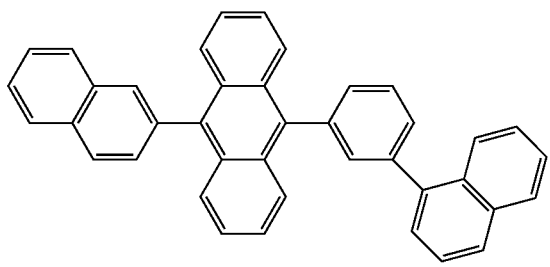

3-4
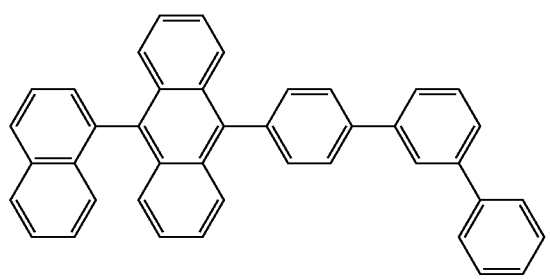

3-5
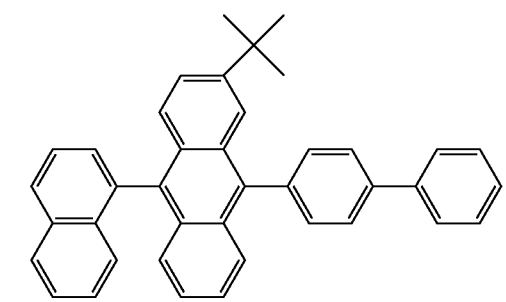

3-6
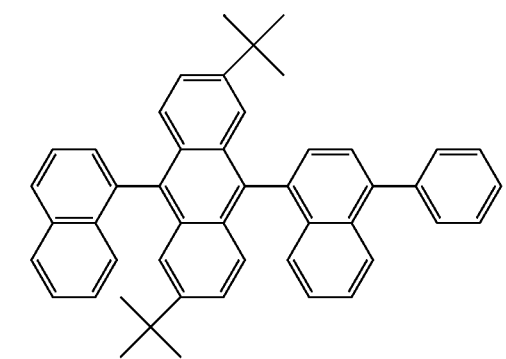

In the organic electroluminescence device 10 according to an example embodiment as shown in FIGS. 1 to 3, the emission layer EML may include a host and a dopant, and the emission layer EML may include the above-described compound represented by Formula C as a host material.

The emission layer EML may further include a suitable material as a host material. For example, the emission layer EML may include, as a host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4''-tris(carbazol-9-yl)triphenylamine (TcTa) or 1,3,5-tris(N-phenylbenzimidazole-2-yl)benzene (TPBi). However, an embodiment is not limited thereto. For example, tris(8-hydroxyquinolino)aluminum (Alq3), 4,4'-bis(N-carbazolyl)-1,1'-biphenyl (CBP), poly(N-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis (triphenylsilyl)benzene (UGH2), hexaphenylcyclotrisiloxane (DPSiO₃), octaphenylcyclotetrasiloxane (DPSiO₄), 2,8-bis(diphenylphosphoryl)dibenzofuran (PPF), etc. may be used as a host material.

In an example embodiment, the emission layer EML may include, as a suitable dopant material, styryl derivatives (for example, 1,4-bis[2-(3-N-ethylcarbazolyl)vinyl]benzene (BCzVB), 4-(di-p-tolylamino)-4'-[(di-p-tolylamino)styryl] stilbene (DPAVB), N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc.

The emission layer may emit any one of red light, green light or blue light. For example, the emission layer may emit blue light having a wavelength range of about 440 nm to about 490 nm.

In the organic electroluminescence device 10 according to an example embodiment as shown in FIGS. 1 to 3, the electron transport region ETR is provided on the emission layer EML. The electron transport region ETR may include at least one of a hole blocking layer HBL, an electron transport layer ETL or an electron injection layer EIL.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. In addition, the electron transport region ETR may have a single layer structure having a plurality of different materials, or a laminated structure of electron transport layer ETL/electron injection layer EIL, or hole blocking layer HBL/electron transport layer ETL/electron injection layer EIL, laminated in order from the emission layer EML. The thickness of the electron transport region ETR may be, for example, from about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

In case the electron transport region ETR includes the electron transport layer ETL, the electron transport region ETR may include anthracene derivatives. In another example embodiment, the electron transport region may include tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4- phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1.O8)-(1,1'-Biphenyl-4-olato)aluminum (BAIq), berylliumbis (benzoquinolin-10-olate) (Bebq$_2$). 9,10-di(naphthalen-2-yl) anthracene (ADN), or a mixture thereof. The thickness of the electron transport layer ETL may be from about 100 Å to about 1,000 Å, for example, from about 150 Å to about 500 Å. If the thickness of the electron transport layer ETL satisfies the above-described range, satisfactory electron transport properties may be obtained without substantial increase of a driving voltage.

When the electron transport region ETR includes the electron injection layer EIL, the electron transport region ETR may use LiF, lithium quinolate (LIQ), Li$_2$O, BaO, NaCl, CsF, a metal in lanthanides such as Yb, or a metal halide such as RbCl and RbI. The electron injection layer EIL also may be formed using a mixture material of an electron transport material and an insulating organometal salt. The organometal salt may be a material having an energy band gap of about 4 eV or more. For example, the organometal salt may include, for example, a metal acetate, a metal benzoate, a metal acetoacetate, a metal acetylacetonate, or a metal stearate. The thickness of the electron injection layer EIL may be from about 1 Å to about 100 Å, for example, from about 3 Å to about 90 Å. In case the thickness of the electron injection layer EIL satisfies the above described range, satisfactory electron injection properties may be obtained without inducing the substantial increase of a driving voltage.

The electron transport region ETR may include a hole blocking layer HBL, as described above. The hole blocking layer HBL may include, for example, at least one of 2,9-dimethyl-4,7-diphenyl-1,10-phenanthroline (BCP) or 4,7-diphenyl-1,10-phenanthroline (Bphen).

The second electrode EL2 is disposed on the electron transport region ETR. The second electrode EL2 may be a common electrode or a cathode. The second electrode EL2 may be a transmissive electrode, a transflective electrode or a reflective electrode. In case the second electrode EL2 is the transmissive electrode, the second electrode EL2 may be formed using transparent metal oxides, for example, ITO, IZO, ZnO, ITZO, etc.

In case the second electrode EL2 is the transflective electrode or the reflective electrode, the second electrode EL2 may include Ag, Mg. Cu, Al. Pt. Pd, Au, Ni. Nd, Ir, Cr, Li, Ca, LiF/Ca, LiF/Al, Mo, Ti, a compound thereof, or a mixture thereof (for example, a mixture of Ag and Mg). The second electrode EL2 may have a multilayer structure including a reflective layer or a transflective layer formed using the above-described materials and a transparent conductive layer formed using ITO, IZO, ZnO. ITZO, etc.

The second electrode EL2 may be connected with an auxiliary electrode. In case the second electrode EL2 is connected with the auxiliary electrode, the resistance of the second electrode EL2 may decrease.

In the organic electroluminescence device 10, according to the application of a voltage to each of the first electrode EL1 and the second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to generate excitons, and light may be emitted via the transition of the excitons from an excited state to a ground state.

Hereinafter, the amine compound and the organic electroluminescence device according to an example embodiment of the inventive concept will be explained in more detail with reference to specific embodiments and comparative embodiments. The following embodiments are illustrated only for assisting the understanding of the inventive concept, and the scope of the inventive concept is not limited thereto.

1. Synthesis Examples

The amine compound according to an example embodiment may be synthesized as follows, for example.

1-1. Synthesis of Compound 2

Compound 2, an amine compound according to an example embodiment, may be synthesized as shown in Reaction scheme 1, for example.

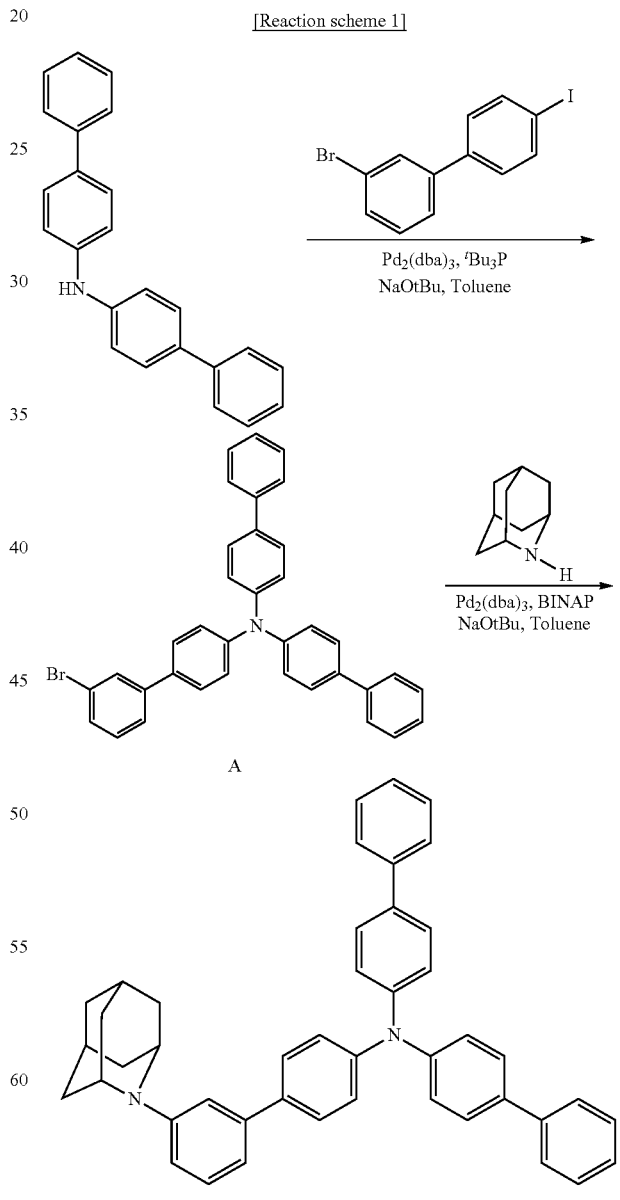

Synthesis of Intermediate A

A suspension of 3-bromo-4'-iodo-1,1'-biphenyl (3.00 g, 8.36 mmol), N-di-[1,1'-biphenyl]-4-amine (2.95 g, 9.19 mmol), bis(dibenzilideneacetone) palladium(0) (0.38 g, 0.42 mmol), tri(tert-butylphosphine) (1.6 M solution, 1.7 mL, 0.84 mmol) and sodium tert-butoxide (2.41 g, 25 mmol) in toluene (100 mL) was degassed and then heated at about 110° C. for about 5 hours under an argon (Ar) atmosphere. After cooling, the reaction solution was filtered through Florisil and the filtrate was concentrated. The concentrate was purified by silica gel column chromatography to obtain Intermediate A (3.55 g, 77%). The molecular weight of Intermediate A measured by FAB-MS was 551.3.

(Synthesis of Compound 2)

A suspension of Intermediate A (1.5 g, 2.7 mmol), 2-aza-adamantane (0.56 g, 4.1 mmol), Pd$_2$(dba)$_3$ (tris(dibenzylideneacetone)dipalladium(0)) (248 mg, 0.271 mmol), (±)-BINAP (0.14 g, 0.489 mmol) and sodium leri-butoxide (0.7 g, 8.14 mmol) in toluene (20 mL) was degassed and then heated at about 110° C. for about 18 hours under an argon (Ar) atmosphere. After cooling, the reaction solution was filtered through Florisil and the filtrate was concentrated. The concentrate was purified by silica gel column chromatography to obtain Compound 2 (0.96 g, 1.56 mmol, 58%). The molecular weight of Compound 2 measured by FAB-MS was 608.8.

1-2. Synthesis of Compound 9

Compound 9, an amine compound according to an example embodiment, may be synthesized as shown in Reaction scheme 2, for example.

-continued

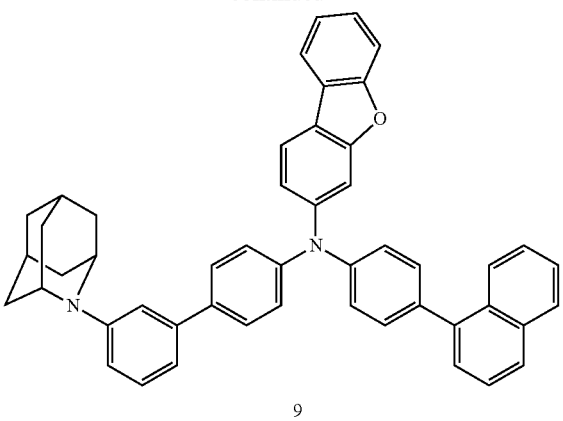

9

(Synthesis of Compound 9)

Compound 9 was synthesized by conducting the same synthetic method of Compound 2 except for using N-(4-(naphthalen-1-yl)phenyl)dibenzo[b,d]furan-3-amine and Intermediate B instead of N-di-[1,1'-biphenyl]-4-amine and Intermediate A in Reaction scheme 1. The molecular weight of Compound 9 measured by FAB-MS was 672.

1-3. Synthesis of Compound 14

Compound 14, an amine compound according to an example embodiment, may be synthesized as shown in Reaction scheme 3, for example.

[Reaction scheme 2]

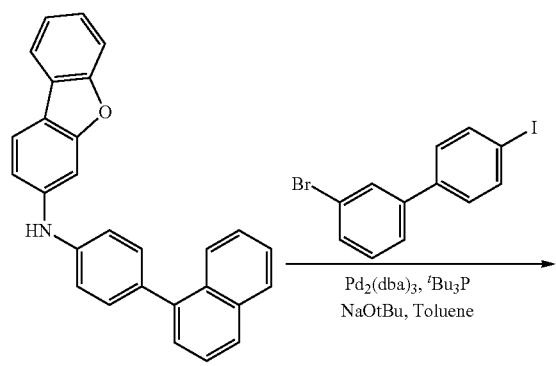

[Reaction scheme 3]

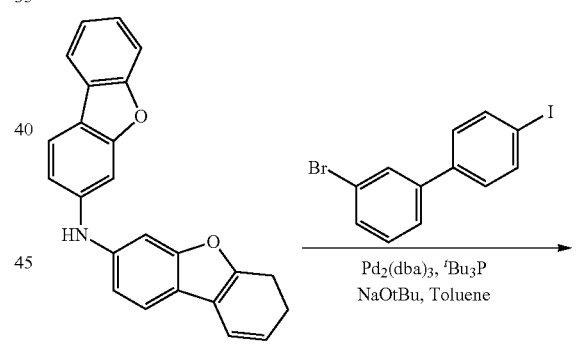

33

-continued

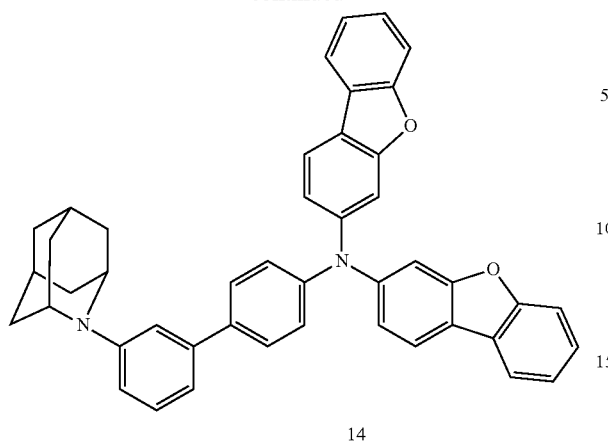

14

(Synthesis of Compound 14)

Compound 14 was synthesized by conducting the same synthetic method of Compound 2 except for using bis(dibenzo[b,d]furan-3-yl)amine and Intermediate C instead of N-di-[1,1'-biphenyl]-4-amine and Intermediate A in Reaction scheme 1. The molecular weight of Compound 14 measured by FAB-MS was 636.

1-4. Synthesis of Compound 17

Compound 17, an amine compound according to an example embodiment, may be synthesized as shown in Reaction scheme 4, for example.

[Reaction scheme 4]

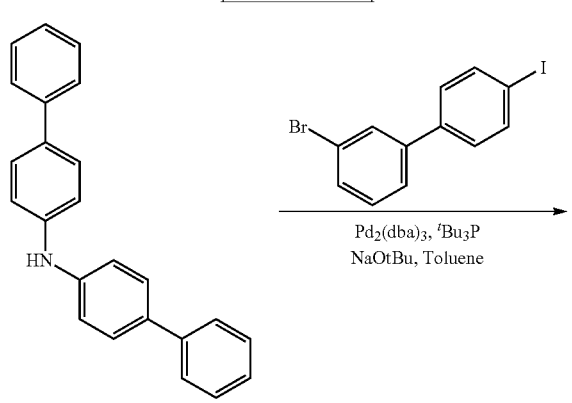

34

-continued

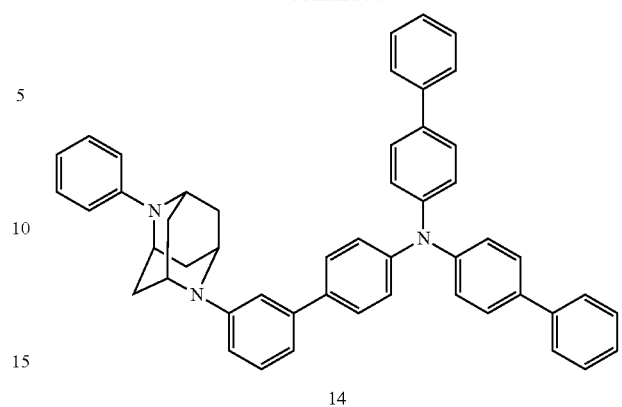

14

(Synthesis of Compound 17)

Compound 17 was synthesized by conducting the same synthetic method of Compound 2 except for using 2-phenyl-2,6-diaza-adamantane instead of 2-aza-adamantane in Reaction scheme 1. The molecular weight of Compound 17 measured by FAB-MS was 685.

2. Manufacturing of organic electroluminescence devices including amine compounds and evaluation thereof 2-1. Examples of Organic Electroluminescence Devices Including Amine Compounds Organic electroluminescence devices of Examples 1 to 3 and Comparative Examples 1 to 7 were manufactured by using the Example Compounds 2, 9 and 14 and Comparative Compounds 1 to 7 as a material for a hole transport layer.

[Example Compounds]

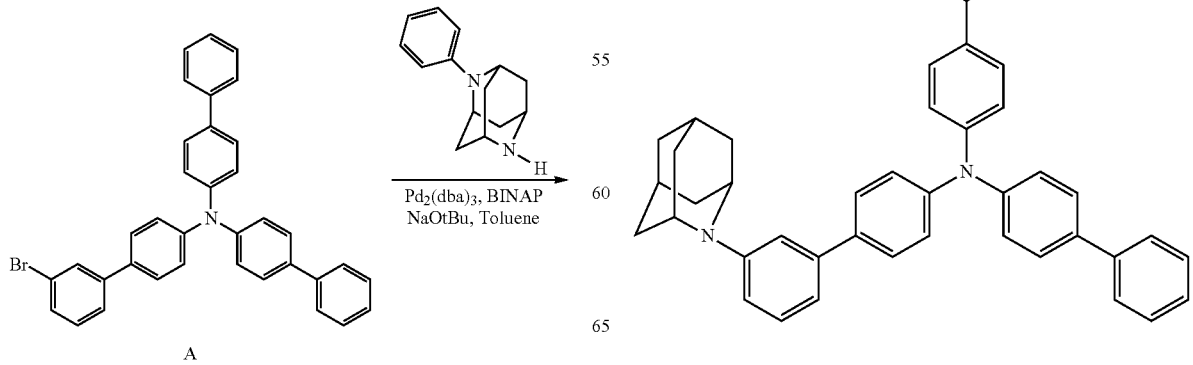

2

9
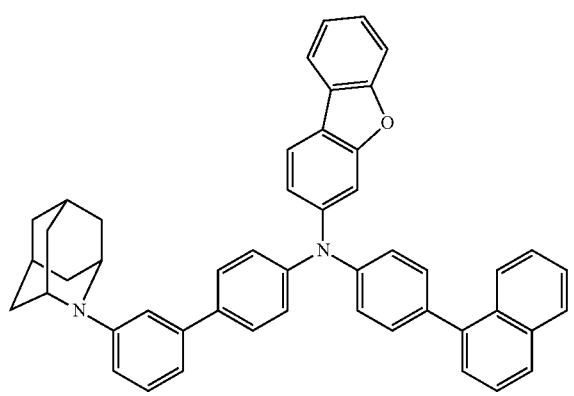
14
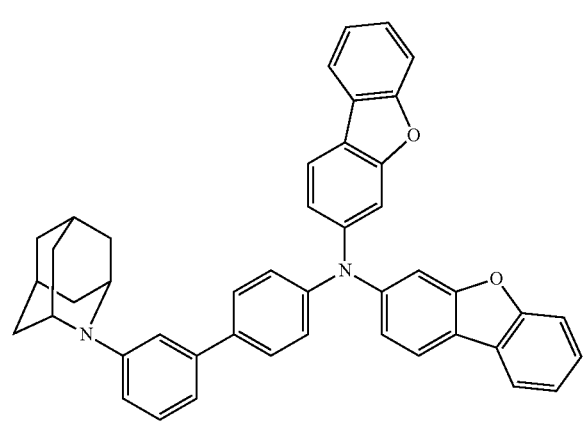
[Comparative Compounds]
C1
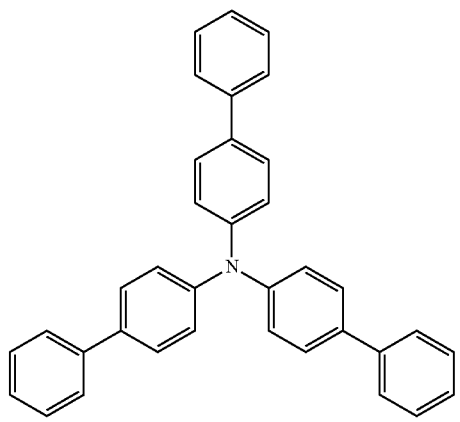
C2
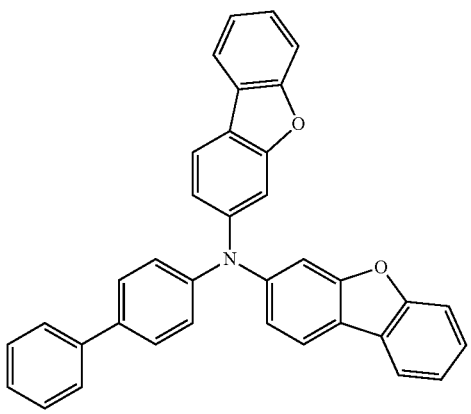
C3
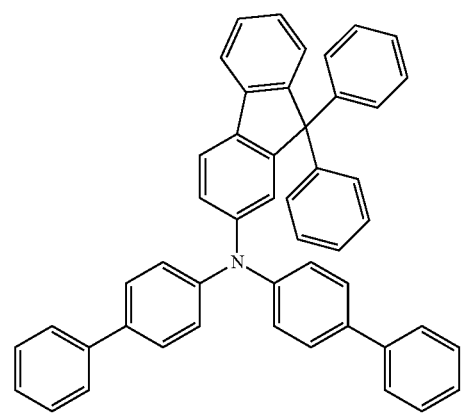
C4
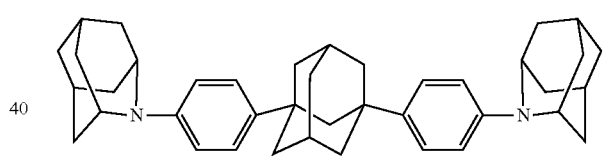
C5
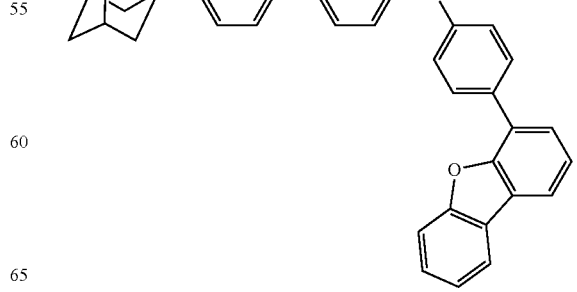

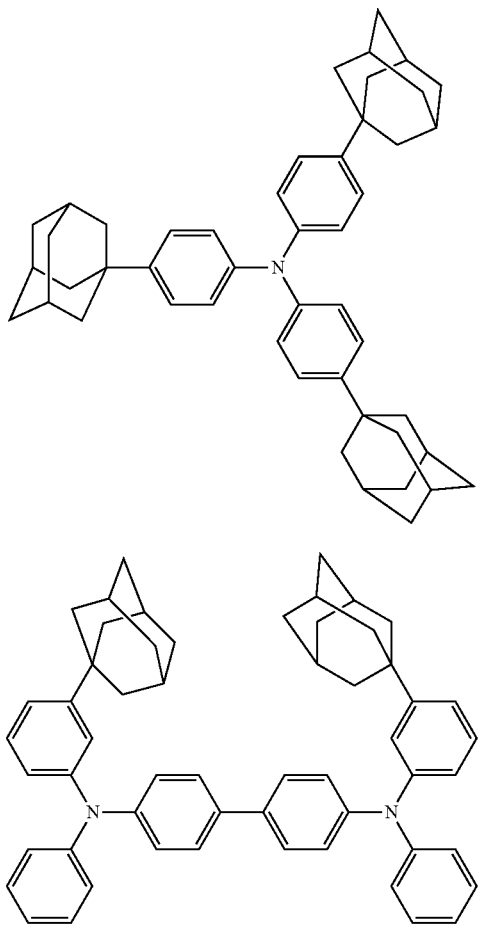

(Manufacturing of Organic Electroluminescence Devices)

The organic electroluminescence devices according to Examples 1 to 3 and Comparative Examples 1 to 7 were manufactured by forming a first electrode EL1 using ITO to a thickness of about 150 nm, a hole injection layer HIL using 2-TNATA to a thickness of about 60 nm, a hole transport layer HTL using the example compounds or the comparative compounds to a thickness of about 30 nm, an emission layer EML using ADN doped with 3% TBP to a thickness of about 25 nm, an electron transport layer ETL using $Alq_3$ to a thickness of about 25 nm, an electron injection layer EIL using LiF to a thickness of about 1 nm, and a second electrode EL2 using Al to a thickness of about 100 nm. Each layer was formed by a vacuum deposition method.

(Property Evaluation of Organic Electroluminescence Devices)

The light emitting property of organic electroluminescence devices was evaluated by using LS-100 Luminance Meter (Konica Minolta, Inc.). A brightness half-life was measured to evaluate the properties of the organic electroluminescence devices manufactured in Examples and Comparative Examples. The half-life was measured by continuous driving at a current density of 1.0 $mA/cm^2$. The light emitting devices used in Examples and Comparative Examples are organic electroluminescence devices emitting blue light. The property evaluation results in Table 1 were shown on the basis (100%) of the brightness half-life of the organic electroluminescence device of Comparative Example 1 using Comparative Compound C1 as a hole transport material.

TABLE 1

| Device manufacturing examples | Material for hole transport layer | Brightness half-life |
|---|---|---|
| Example 1 | Example Compound 2 | 115% |
| Example 2 | Example Compound 9 | 123% |
| Example 3 | Example Compound 14 | 111% |
| Comparative Example 1 | Comparative Compound C1 | 100% |
| Comparative Example 2 | Comparative Compound C2 | 87% |
| Comparative Example 3 | Comparative Compound C3 | 92% |
| Comparative Example 4 | Comparative Compound C4 | 78% |
| Comparative Example 5 | Comparative Compound C5 | 85% |
| Comparative Example 6 | Comparative Compound C6 | 67% |
| Comparative Example 7 | Comparative Compound C7 | 77% |

Referring to the results in Table 1, it may be found that the organic electroluminescence devices using the amine compounds according to an example embodiment as a material for the hole transport layer achieved a long device life. Specifically, the organic electroluminescence devices of Examples 1 to 3 had brightness half-life of 111% to 123%, attaining a long device life. Meanwhile, the organic electroluminescence devices of Comparative Examples 1 to 7 had brightness half-life of 67% to 100%, which shows a short device life when compared with those of Examples.

Without being bound by theory, it is believed that aza-adamantyl group and diaza-adamantyl group have no $pi(\pi)$-electron and are not involved in electron transport. They have a structure in which a saturated hydrocarbon backbone with a strong steric hindrance effect enfolds nitrogen atom responsible for hole transport, thereby unshared electron pair of nitrogen atom being sterically protected. Accordingly, an aza-adamantyl group or a diaza-adamantyl group in the interface with the emission layer may hold unexcited electrons in the emission layer, thereby enhancing electron resistance of a hole transport material having low electron resistance and inhibiting deterioration thereof. For that reason, the organic electroluminescence devices using Example Compounds which have at least one of aza-adamantyl group or diaza-adamantyl group seem to achieve enhanced brightness half-life, when compared with those of Comparative Examples 5 to 7 using Comparative Compounds which have an adamantyl group. It may be found that the organic electroluminescence device using Comparative Compound C4 which has an aza-adamantyl group, but no triarylamine backbone has decreased brightness half-life, when compared with those of Examples. In the organic electroluminescence device using the compound with no triarylamine backbone, insufficient holes injected into the emission layer results in increase of unexcited electrons, which seems to lead to decreased brightness half-life.

By way of summation and review, in an application of an organic electroluminescence device to a display, extension of life for the organic electroluminescence device is desired, and development of materials therefor is also desired.

As described above, the organic electroluminescence device according to an example embodiment uses a triarylamine compound having at least one of aza-adamantyl group or diaza-adamantyl group as a material for at least one of organic layers, thereby attaining a long device life. The amine compound according to an example embodiment with a triarylamine backbone having at least one of aza-adamantyl group or diaza-adamantyl group may be applied to an organic electroluminescence device, thereby contributing to a long device life.

The organic electroluminescence device according to an example embodiment may attain a long device life.

The amine compound according to an example embodiment may be applied to an organic electroluminescence device, thereby contributing to a long device life.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in claims.

What is claimed is:

1. An organic electroluminescence device, comprising:
a first electrode;
a second electrode disposed on the first electrode; and
a plurality of organic layers disposed between the first electrode and the second electrode, at least one of the organic layers including an amine compound represented by Formula 1:

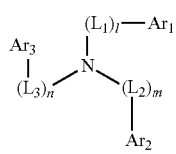

[Formula 1]

where $L_1$ to $L_3$ are each independently a direct linkage, a substituted or unsubstituted arylene group having 6 to 30 ring carbon atoms, or a substituted or unsubstituted heteroarylene group having 5 to 30 ring carbon atoms, 1, m, and n are each independently 1 or 2, $Ar_1$ to $Ar_3$ are each independently a substituted or unsubstituted aryl group having 6 to 30 ring carbon atoms, a substituted or unsubstituted heteroaryl group having 5 to 30 ring carbon atoms, or a group represented by Formula 2, provided that at least one of $Ar_1$ to $Ar_3$ is the group represented by Formula b 2:

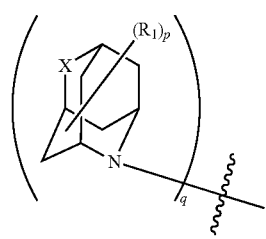

[Formula 2]

where X is $CR_2R_3$ or $NR_4$, $R_1$ to $R_4$ are each independently a hydrogen atom, a deuterium atom, a halogen atom, a cyano group, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted arylthio group having 6 to 30 ring carbon atoms, a substituted or unsubstituted alkylamino group having 1 to 10 carbon atoms, a substituted or unsubstituted arylamino group having 6 to 30 ring carbon atoms, a substituted or unsubstituted aryl group having 6 to 50 ring carbon atoms, or a substituted or unsubstituted heteroaryl group having 2 to 50 ring carbon atoms, or form a ring by combining adjacent groups with each other, p is an integer of 1 to 12, and q is 1 or 2.

2. The organic electroluminescence device as claimed in claim 1, wherein Formula 2 is represented by Formula 3-1 or 3-2:

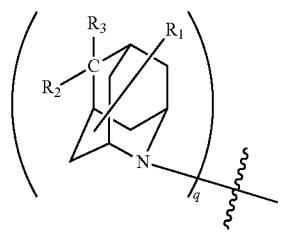

[Formula 3-1]

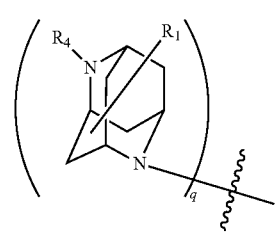

[Formula 3-2]

where $R_1$ to $R_4$, and q are the same as defined in Formula 2.

3. The organic electroluminescence device as claimed in claim 2, wherein $R_1$ to $R_4$ are each independently a hydrogen atom, a substituted or unsubstituted aryl group having 6 to 50 ring carbon atoms, or a substituted or unsubstituted heteroaryl group having 2 to 50 ring carbon atoms, and q is the same as defined in Formula 2.

4. The organic electroluminescence device as claimed in claim 3, wherein $R_1$ to $R_4$ are each independently a hydrogen atom, a substituted or unsubstituted phenyl group, a substituted or unsubstituted naphthyl group, a substituted or unsubstituted fluorenyl group, a substituted or unsubstituted carbazole group, a substituted or unsubstituted dibenzofuran group, or a substituted or unsubstituted dibenzothiophene group.

5. The organic electroluminescence device as claimed in claim 1, wherein $L_1$ to $L_3$ are each independently a direct linkage, a substituted or unsubstituted phenylene group, a substituted or unsubstituted divalent biphenyl group, or a substituted or unsubstituted fluorenylene group.

6. The organic electroluminescence device as claimed in claim 1, wherein $Ar_1$ to $Ar_3$ are each independently the group represented by Formula 2, a substituted or unsubstituted phenyl group, a substituted or unsubstituted biphenyl group, a substituted or unsubstituted naphthyl group, a substituted or unsubstituted fluorenyl group, a substituted or unsubstituted phenanthryl group, a substituted or unsubstituted dibenzofuranyl group, or a substituted or unsubstituted dibenzothiophenyl group.

7. The organic electroluminescence device as claimed in claim 1, wherein Ar$_1$ to Ar$_3$ are each independently:
the group represented by Formula 2,
an aryl group substituted with a methyl group, an aryl group substituted with an unsubstituted phenyl group, or an aryl group substituted with a triphenylsilyl group, or
a heteroaryl group substituted with a methyl group, a heteroaryl group substituted with an unsubstituted phenyl group, or a heteroaryl group substituted with a triphenylsilyl group.

8. The organic electroluminescence device as claimed in claim 1, wherein one or two from Ar$_1$ to Ar$_3$ are represented by Formula 2.

9. The organic electroluminescence device as claimed in claim 1, wherein the organic layers include:
a hole transport region disposed on the first electrode;
an emission layer disposed on the hole transport region; and
an electron transport region disposed on the emission layer, and
the hole transport region includes the amine compound represented by Formula 1.

10. The organic electroluminescence device as claimed in claim 1, wherein the amine compound is a compound selected from Compound Group 1:

[Compound Group 1]

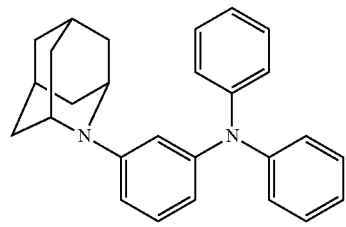

1

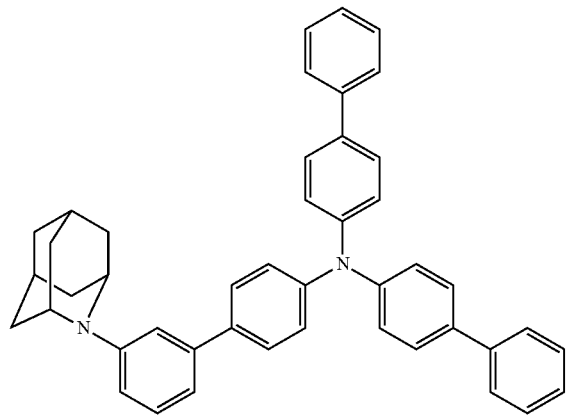

2

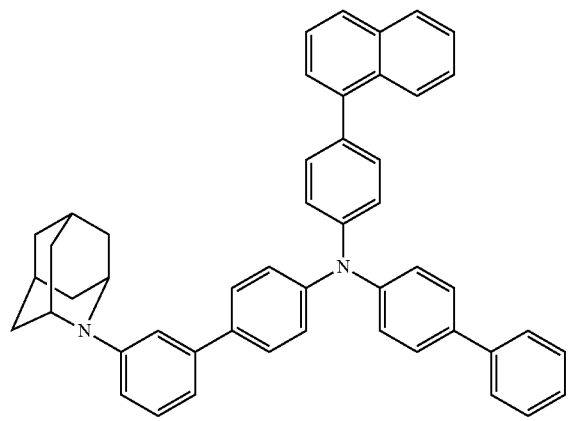

3

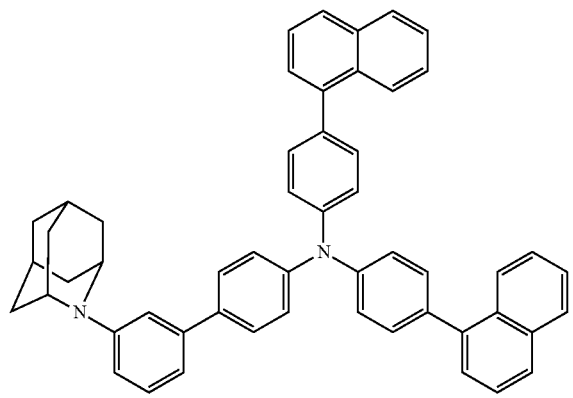

4

5
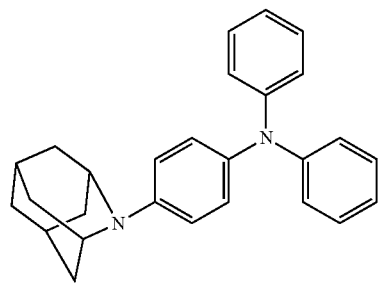
6
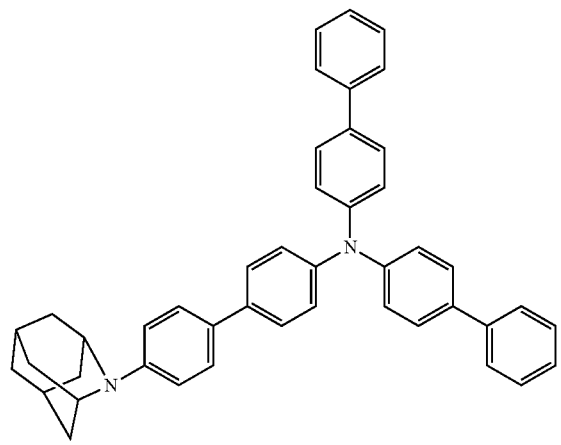
7
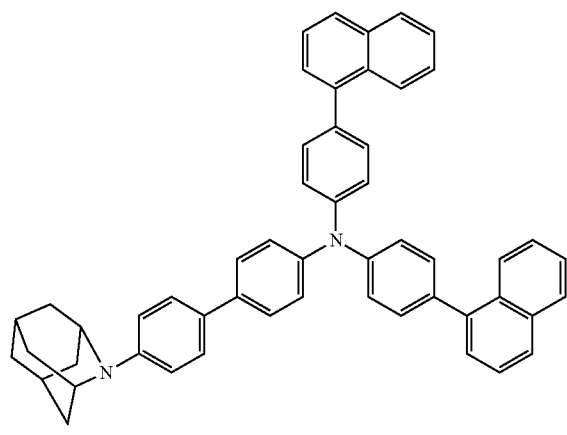
8
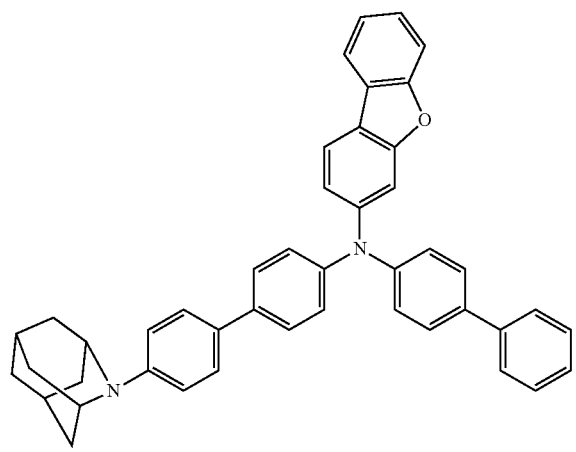
9
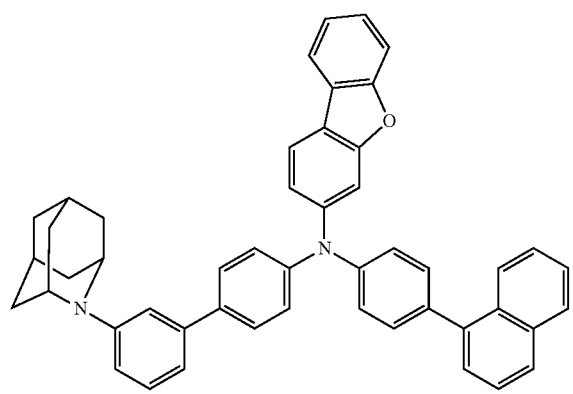
10
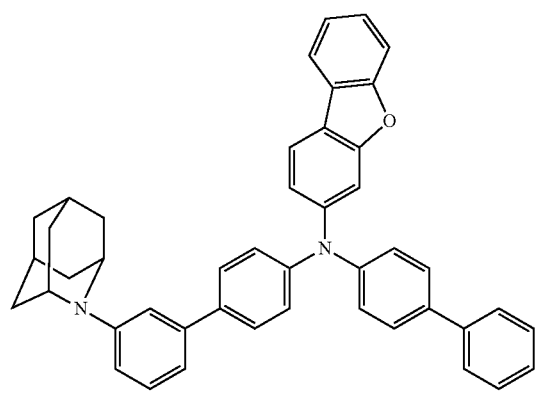

-continued
11
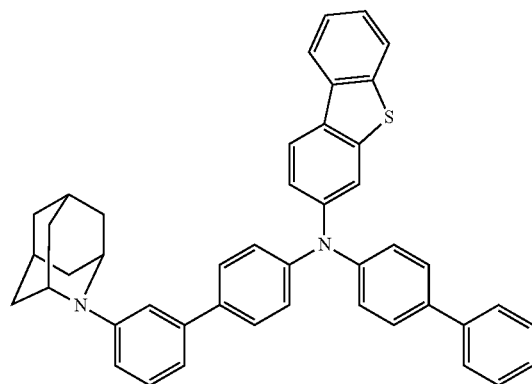
12
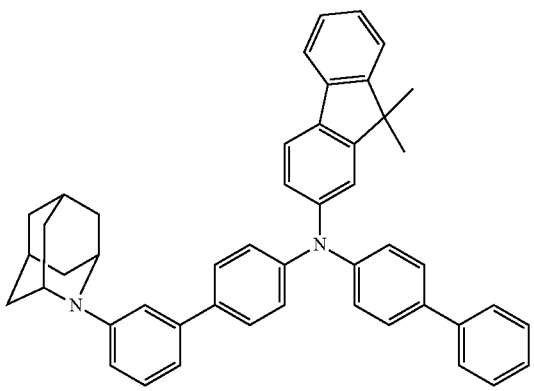
13
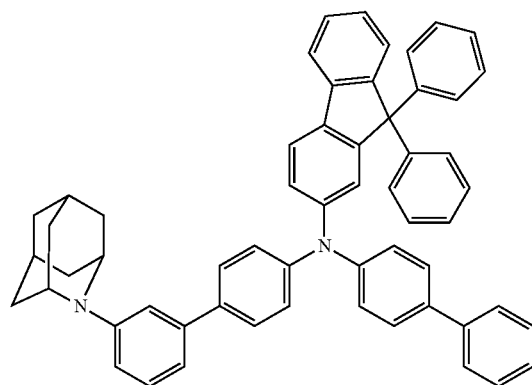
14
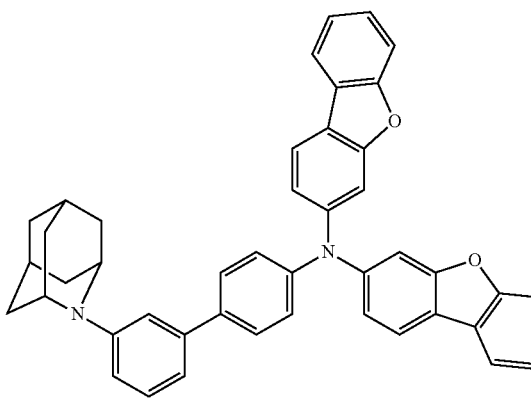
15
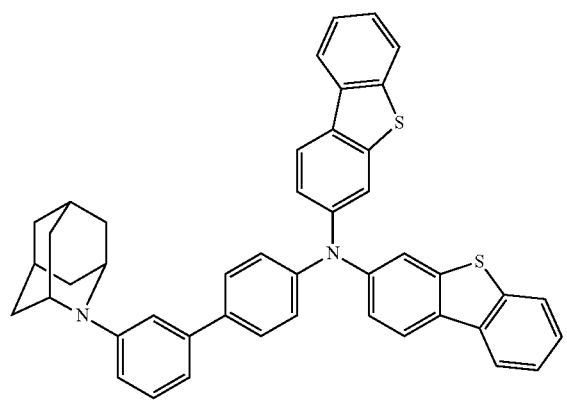
16
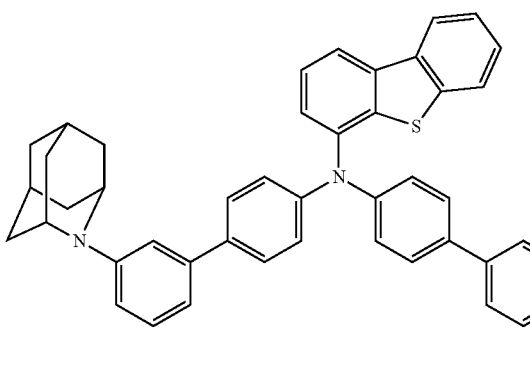
17
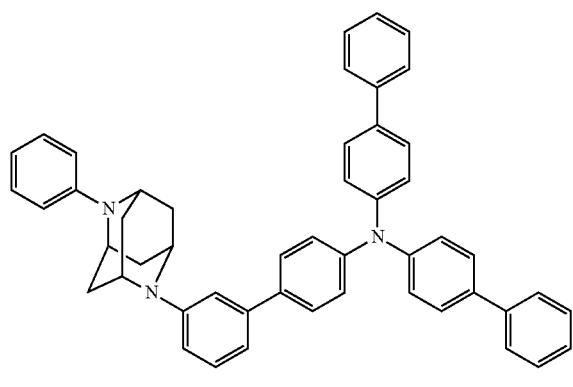
18
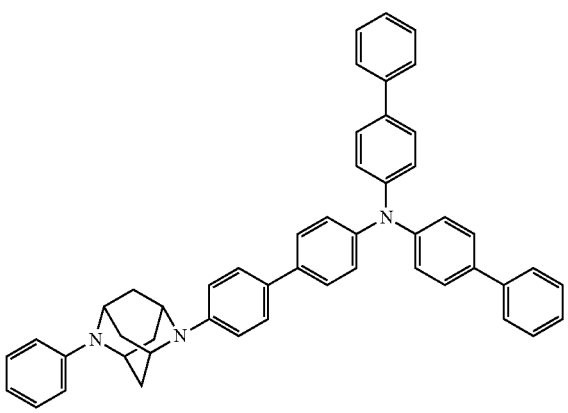

-continued
19
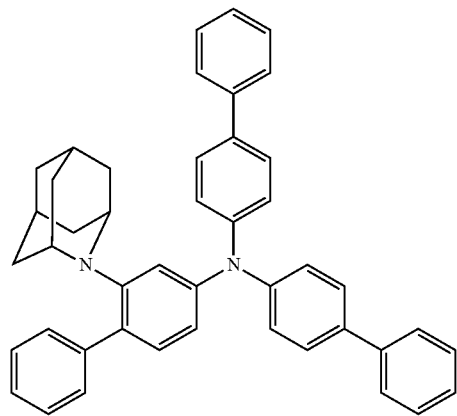
20
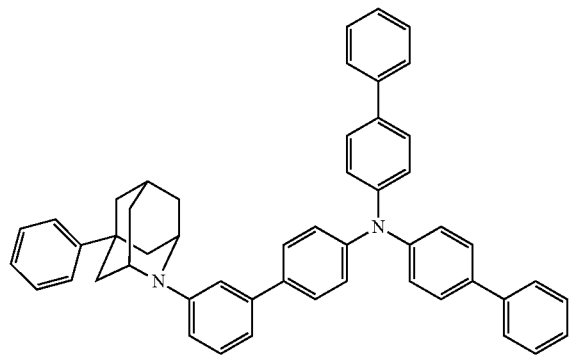
21
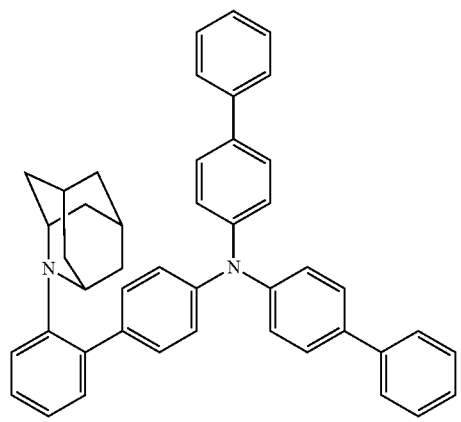
22
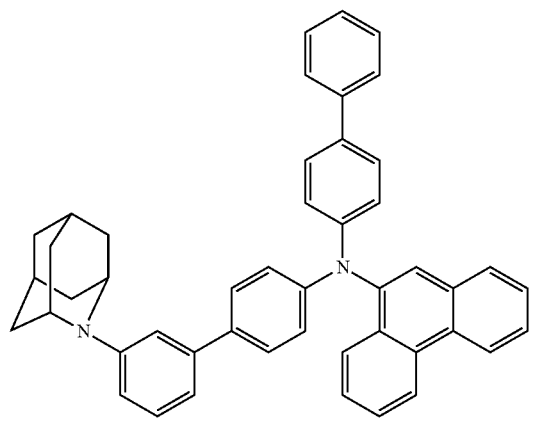
23
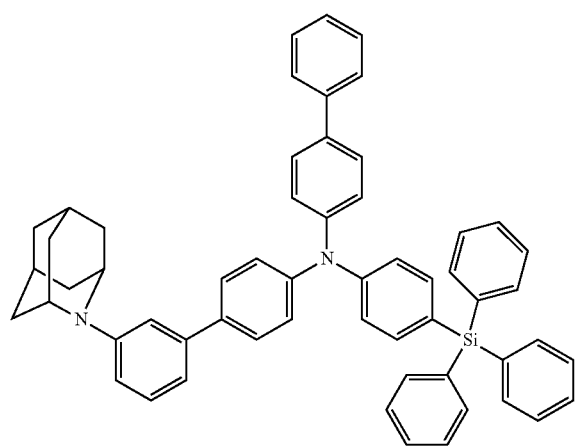
24
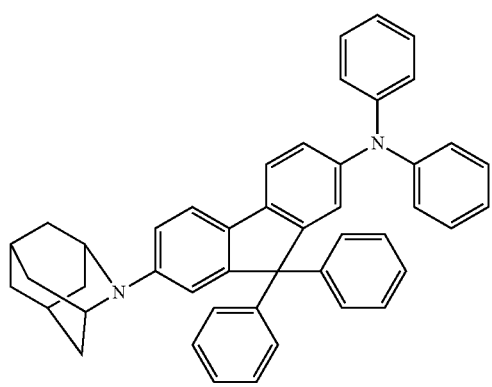

-continued
25
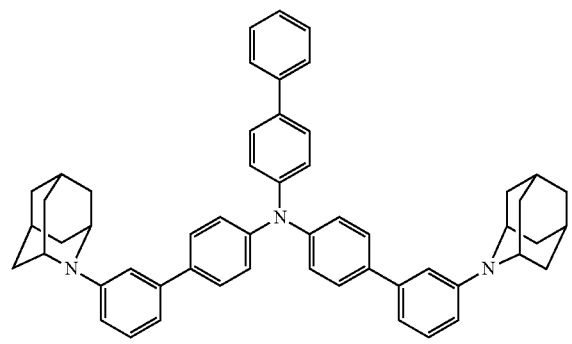
26
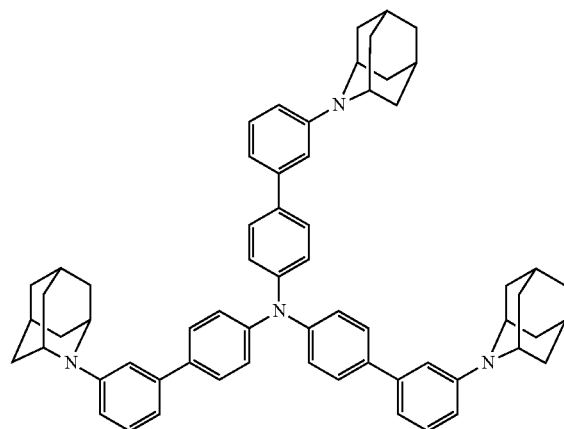
27
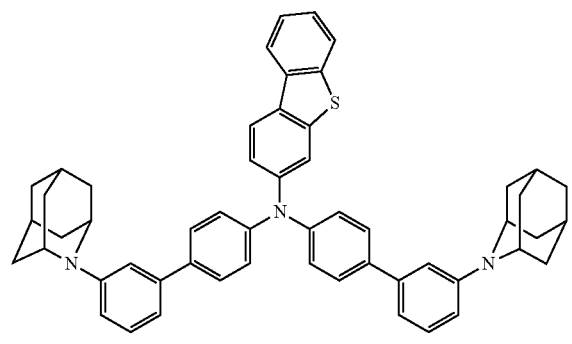
28
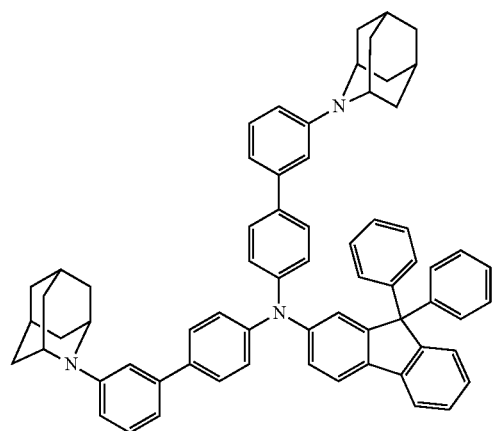
29
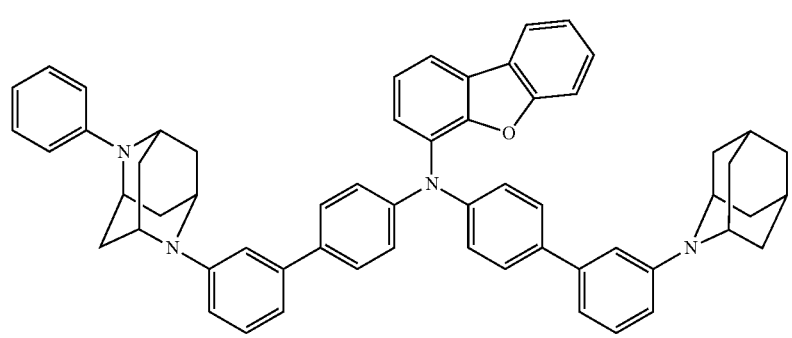

-continued
30
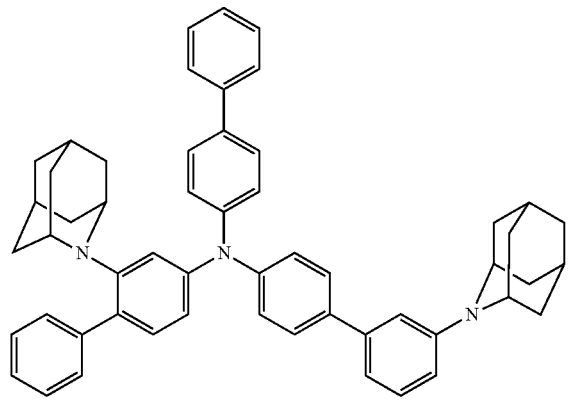
31
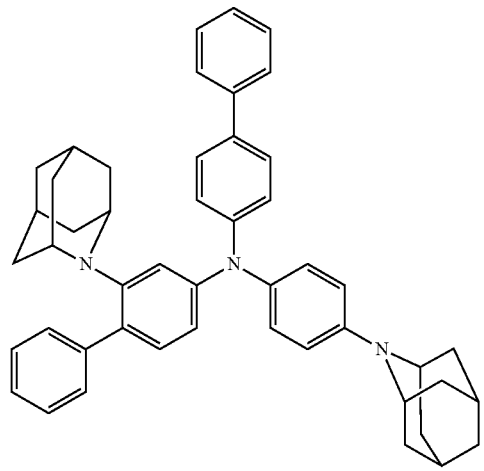
32
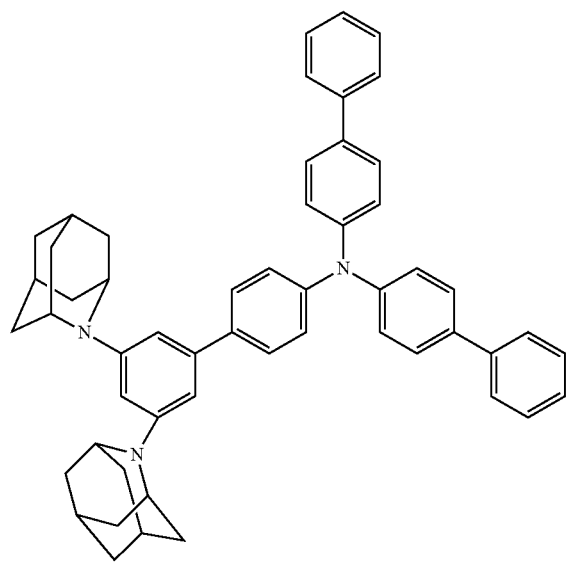
33
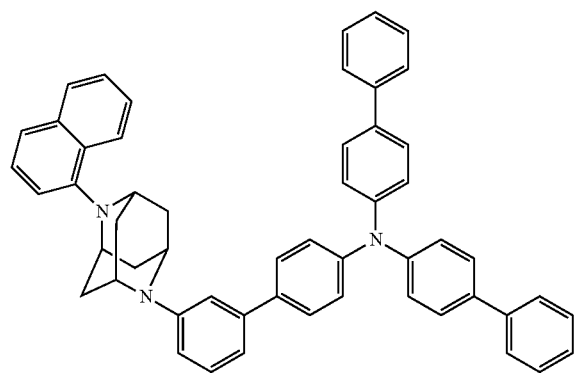
34
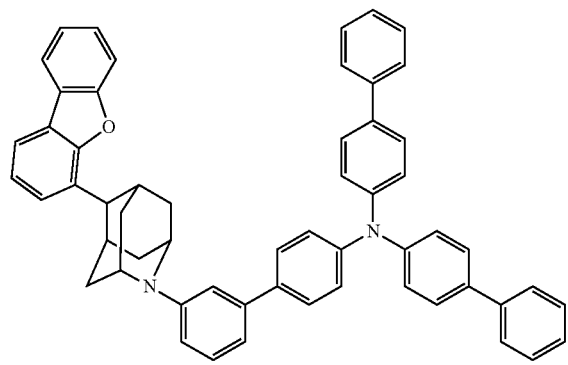
35
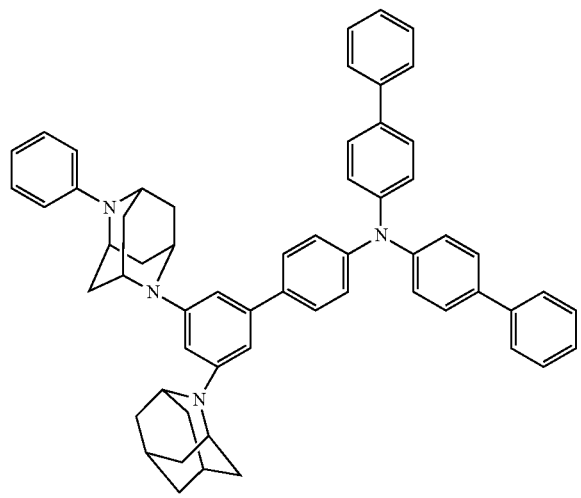

-continued

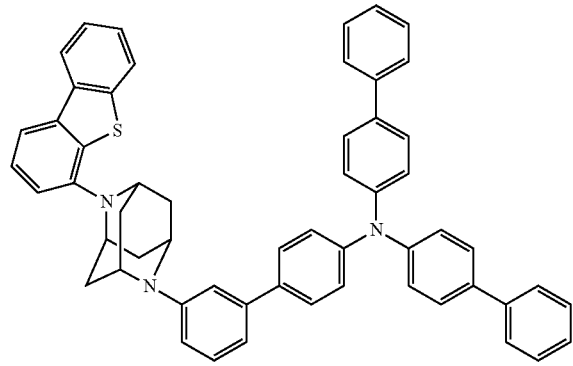
36

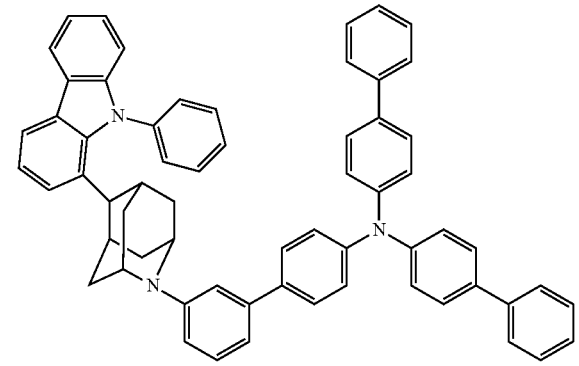
37

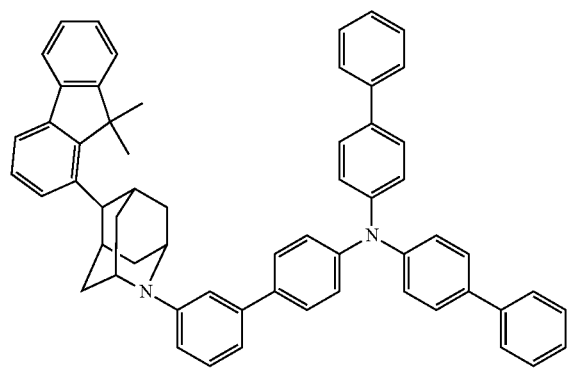
38

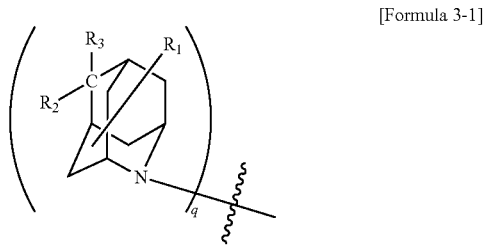
39

11. An amine compound represented by Formula 1:

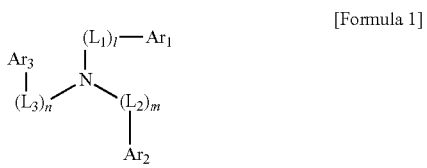
[Formula 1]

where $L_1$ to $L_3$ are each independently a direct linkage, a substituted or unsubstituted arylene group having 6 to 30 ring carbon atoms, or a substituted or unsubstituted heteroarylene group having 5 to 30 ring carbon atoms,
l, m, and n are each independently 1 or 2,
$Ar_1$ to $Ar_3$ are each independently a substituted or unsubstituted aryl group having 6 to 30 ring carbon atoms, a substituted or unsubstituted heteroaryl group having 5 to 30 ring carbon atoms, or a group represented by Formula 2, provided that at least one of $Ar_1$ to $Ar_3$ is the group represented by Formula 2:

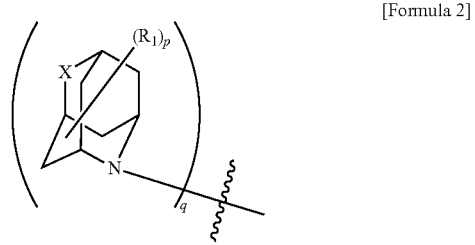
[Formula 2]

where X is $CR_2R_3$ or $NR_4$,
$R_1$ to $R_4$ are each independently a hydrogen atom, a deuterium atom, a halogen atom, a cyano group, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted arylthio group having 6 to 30 ring carbon atoms, a substituted or unsubstituted alkylamino group having 1 to 10 carbon atoms, a substituted or unsubstituted arylamino group having 6 to 30 ring carbon atoms, a substituted or unsubstituted aryl group having 6 to 50 ring carbon atoms, or a substituted or unsubstituted heteroaryl group having 2 to 50 ring carbon atoms, or form a ring by combining adjacent groups with each other,
p is an integer of 1 to 12, and
q is 1 or 2.

12. The amine compound as claimed in claim 11, wherein Formula 2 is represented by Formula 3-1 or 3-2:

[Formula 3-1]

[Formula 3-2]

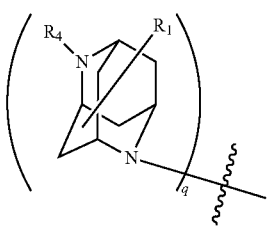

where R₁ to R₄, and q are the same as defined in Formula 2.

13. The amine compound as claimed in claim 12, wherein $R_1$ to $R_4$ are each independently a hydrogen atom, a substituted or unsubstituted aryl group having 6 to 50 ring carbon atoms, or a substituted or unsubstituted heteroaryl group having 2 to 50 ring carbon atoms, and q is the same as defined in Formula 2.

14. The amine compound as claimed in claim 12, wherein $R_1$ to $R_4$ are each independently a hydrogen atom, a substituted or unsubstituted phenyl group, a substituted or unsubstituted naphthyl group, a substituted or unsubstituted fluorenyl group, a substituted or unsubstituted carbazole group, a substituted or unsubstituted dibenzofuran group, or a substituted or unsubstituted dibenzothiophene group.

15. The amine compound as claimed in claim 12, wherein Formula 3-1 is represented by Formula 4-1-1 or 4-1-2, and Formula 3-2 is represented by Formula 4-2:

[Formula 4-1-1]

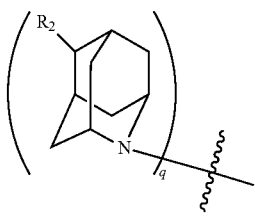

[Formula 4-1-2]

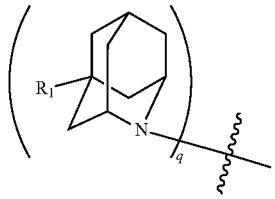

[Formula 4-2]

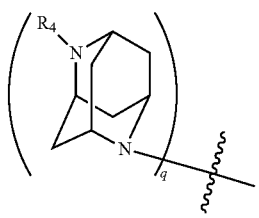

where $R_1$, $R_2$, $R_4$ and q are the same as defined in Formulae 3-1 and 3-2.

16. The amine compound as claimed in claim 11, wherein $L_1$ to $L_3$ are each independently a direct linkage, a substituted or unsubstituted phenylene group, a substituted or unsubstituted divalent biphenyl group, or a substituted or unsubstituted fluorenylene group.

17. The amine compound as claimed in claim 11, wherein $Ar_1$ to $Ar_3$ are each independently the group represented by Formula 2, a substituted or unsubstituted phenyl group, a substituted or unsubstituted biphenyl group, a substituted or unsubstituted naphthyl group, a substituted or unsubstituted fluorenyl group, a substituted or unsubstituted phenanthryl group, a substituted or unsubstituted dibenzofuranyl group, or a substituted or unsubstituted dibenzothiophenyl group.

18. The amine compound as claimed in claim 11, wherein $Ar_1$ to $Ar_3$ are each independently the group represented by Formula 2, an aryl group substituted with a methyl group, an unsubstituted phenyl group, or a triphenylsilyl group, or a heteroaryl group substituted with a methyl group, an unsubstituted phenyl group, or a triphenylsilyl group.

19. The amine compound as claimed in claim 11, wherein one or two of $Ar_1$ to $Ar_3$ are represented by Formula 2.

20. The amine compound as claimed in claim 11, wherein the amine compound is a compound selected from Compound Group 1:

[Compound Group 1]

1

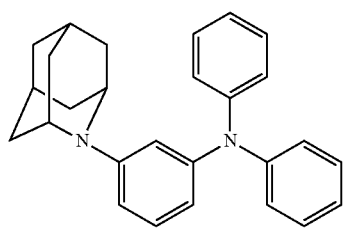

2

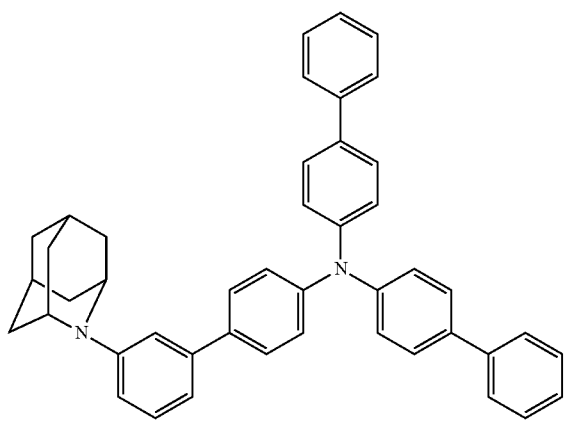

-continued
3
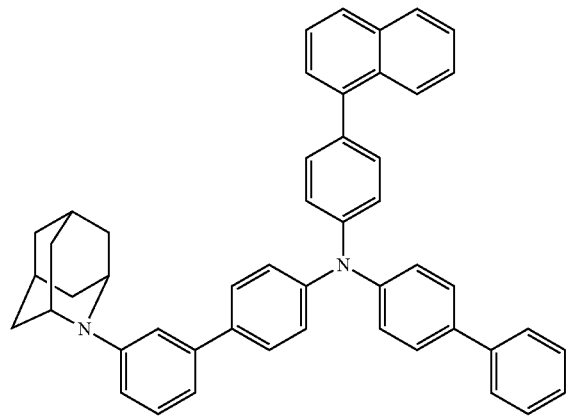
4
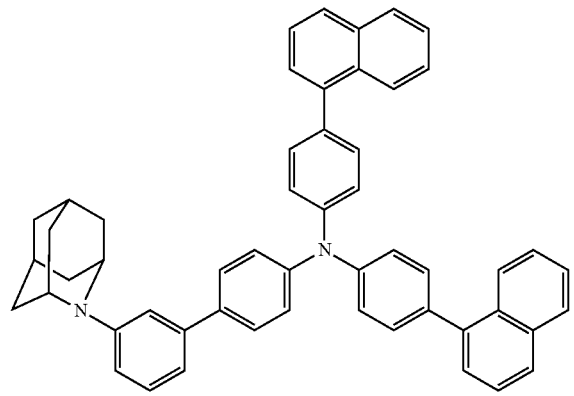
5
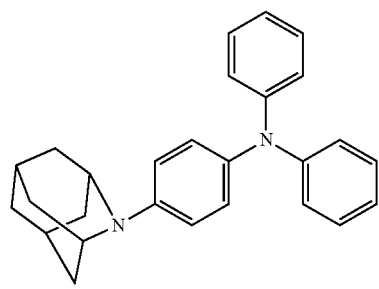
6
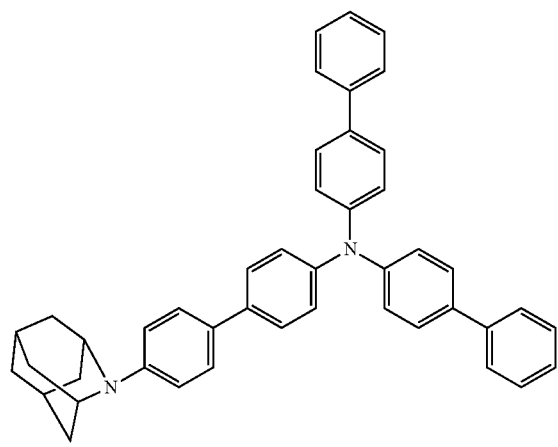
7
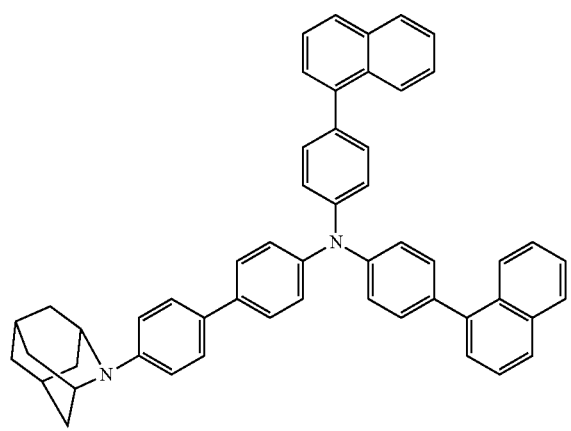
8
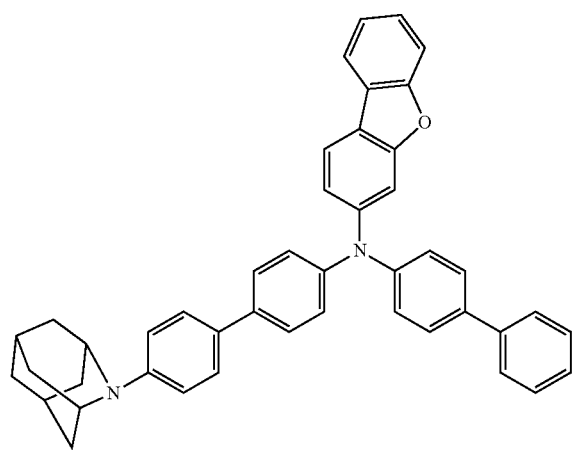

-continued
9
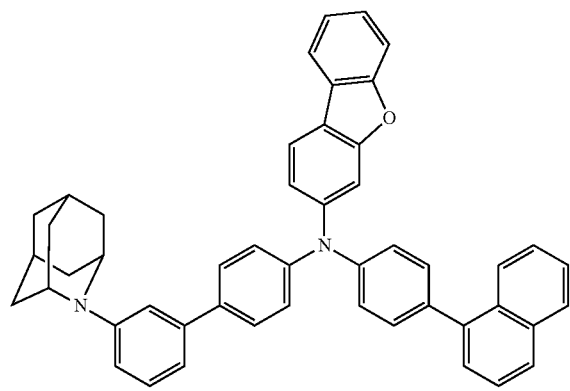
10
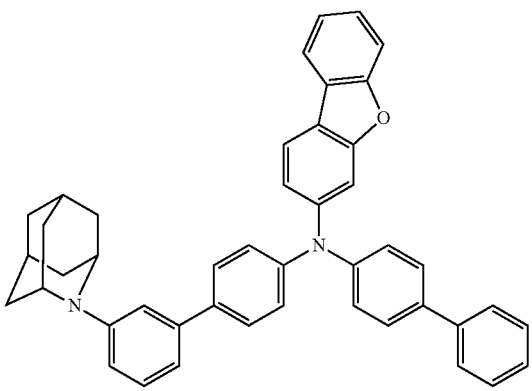
11
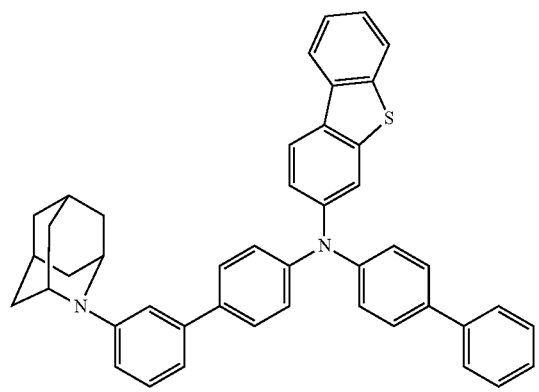
12
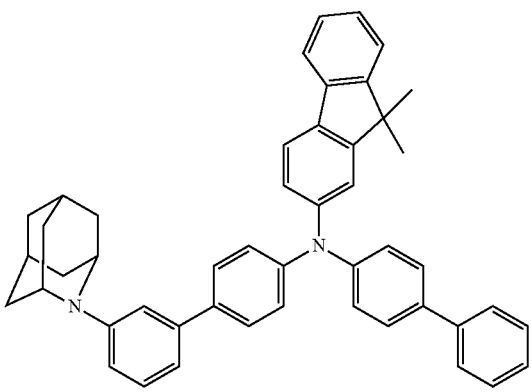
13
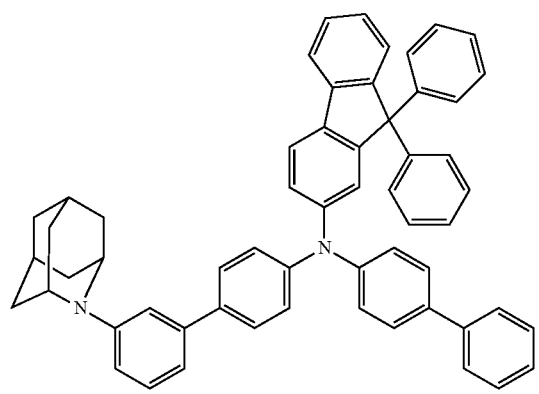
14
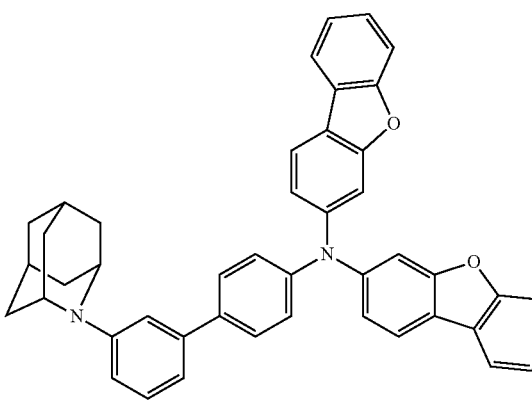
15
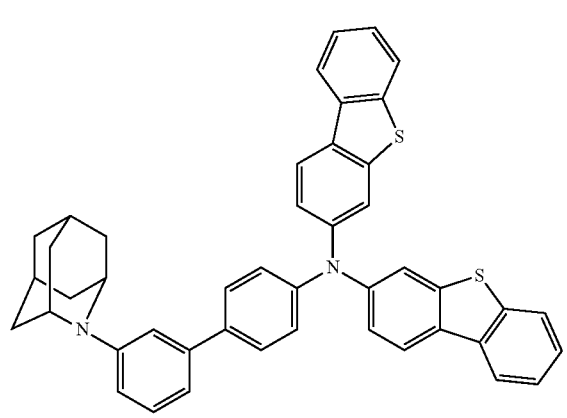
16
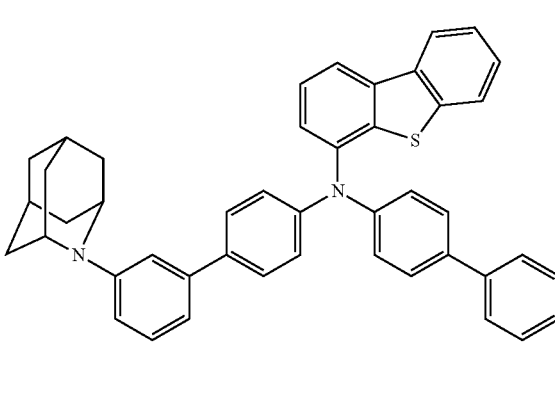

-continued
17
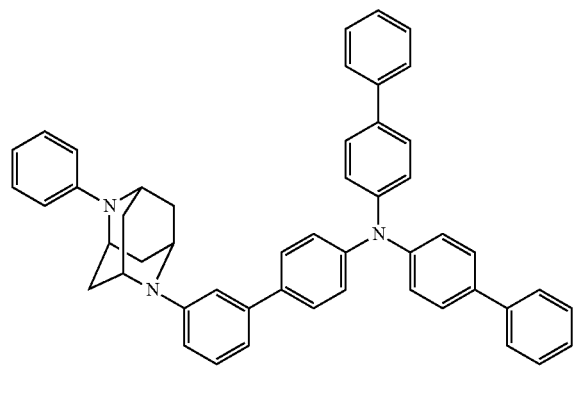
18
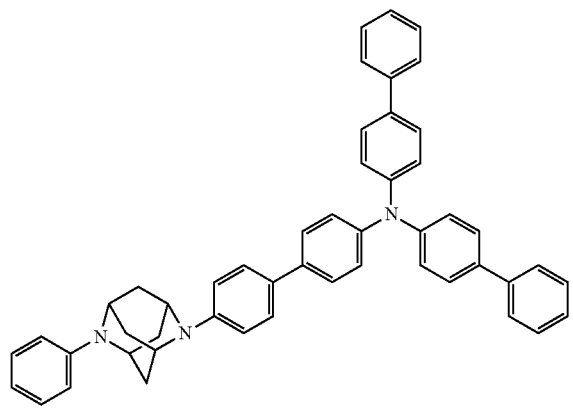
19
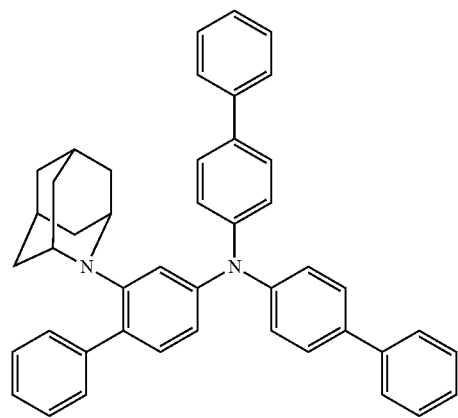
20
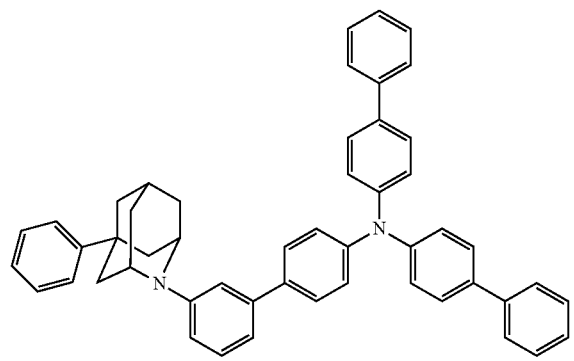
21
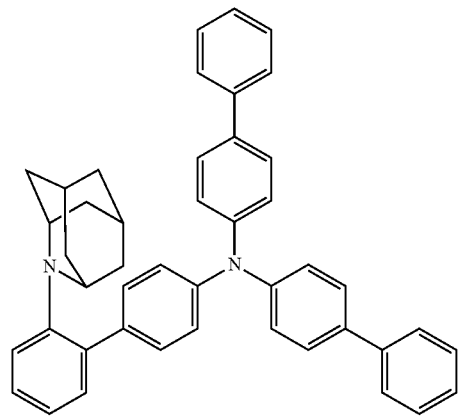
22
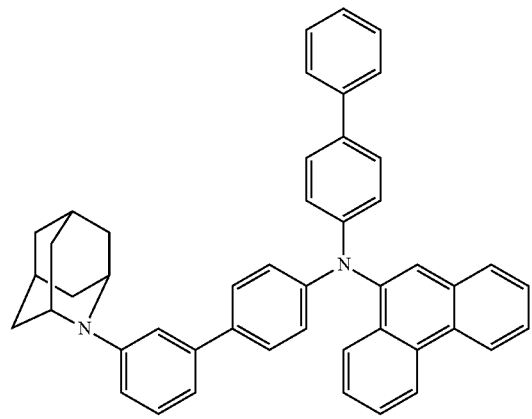

-continued
23
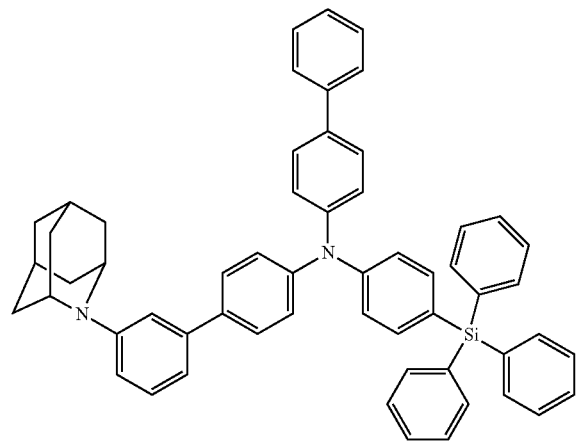
24
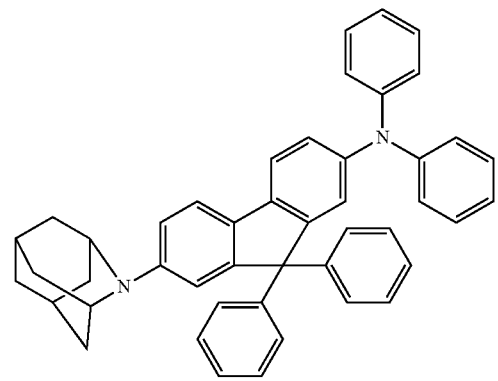
25
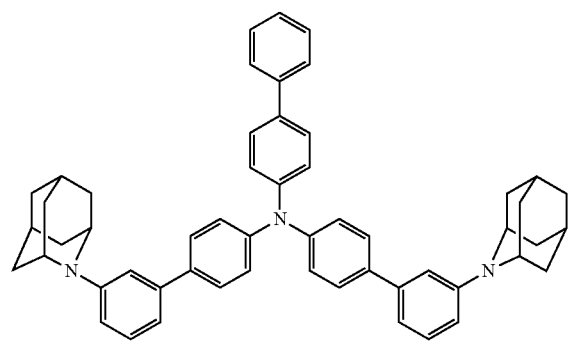
26
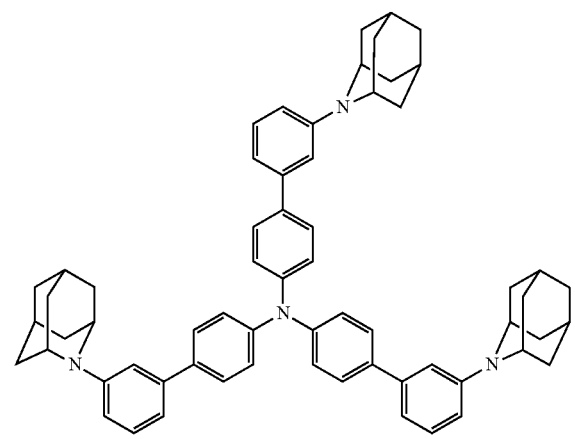
27
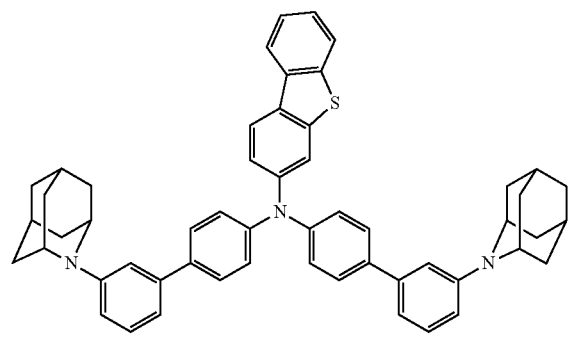
28
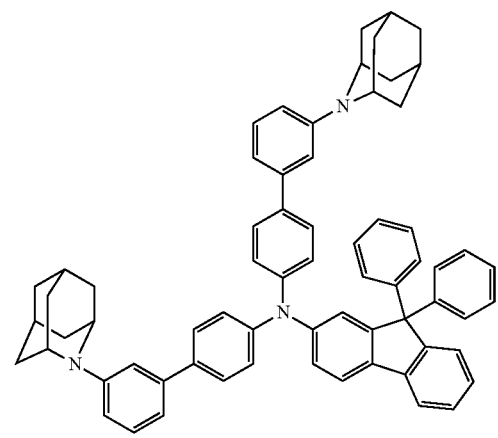

29
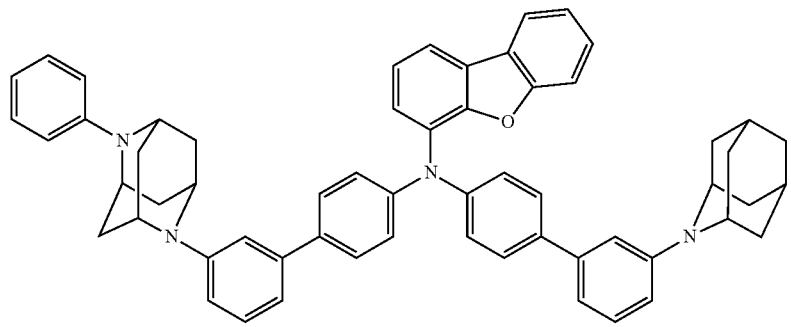
30 31
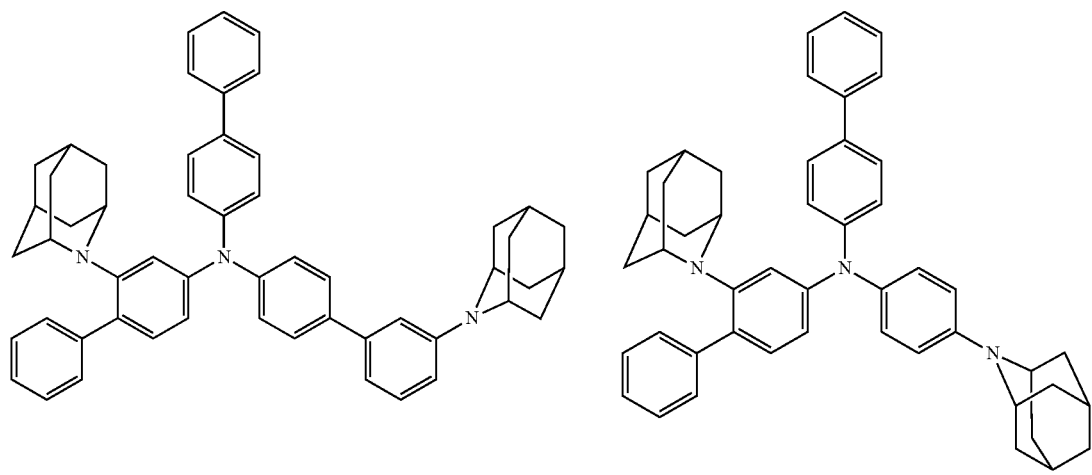
32 33
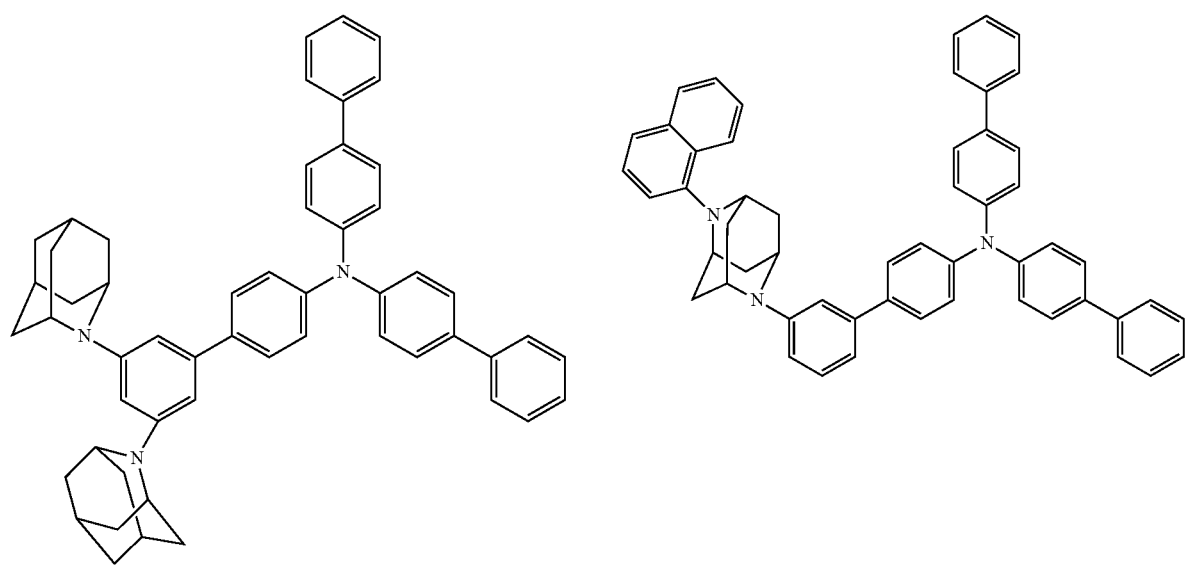

-continued
34
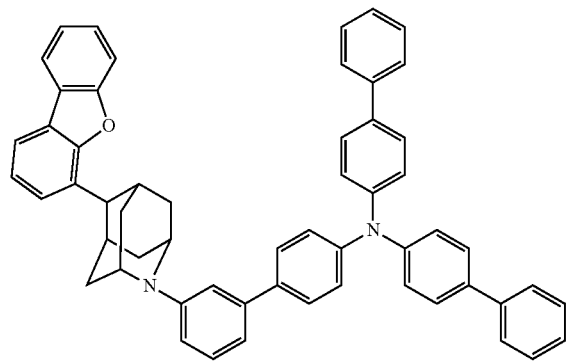
35
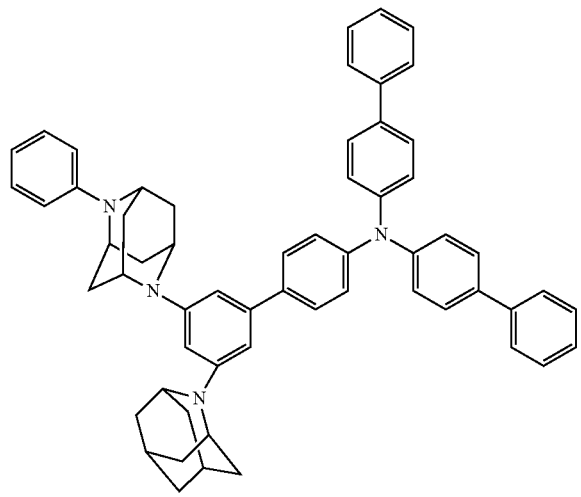
36
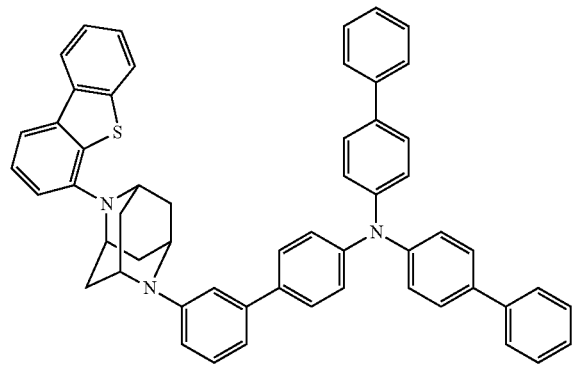
37
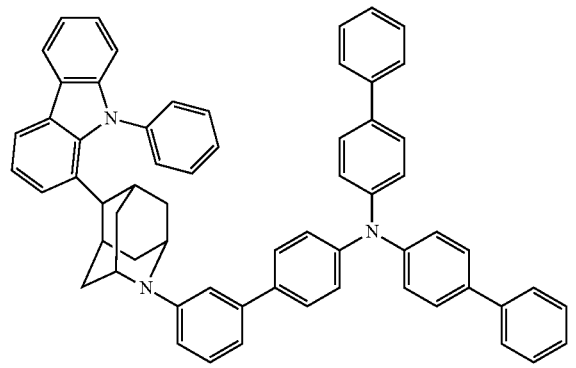
38
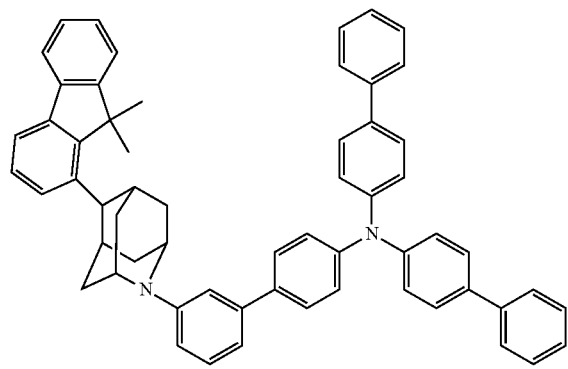
39
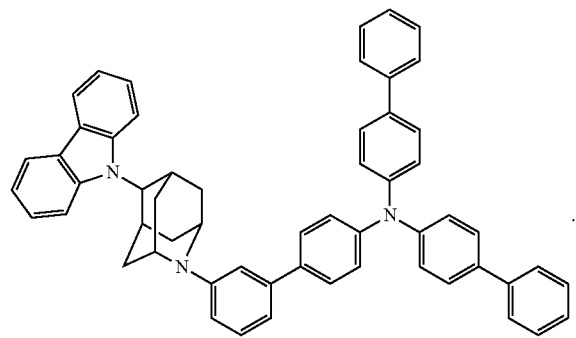
* * * * *